US008878122B2

United States Patent
Yokogawa

(10) Patent No.: US 8,878,122 B2
(45) Date of Patent: Nov. 4, 2014

(54) TWO DIMENSIONAL SOLID-STATE IMAGE PICKUP DEVICE WITH A LIGHT CONDENSING ELEMENT INCLUDING PROTRUSIONS SEPARATED BY RECESSES

(75) Inventor: Sozo Yokogawa, Tokyo (JP)

(73) Assignee: Sony Corporation, Tokyo (JP)

( * ) Notice: Subject to any disclaimer, the term of this patent is extended or adjusted under 35 U.S.C. 154(b) by 788 days.

(21) Appl. No.: 12/588,794

(22) Filed: Oct. 28, 2009

(65) Prior Publication Data

US 2010/0127156 A1   May 27, 2010

(30) Foreign Application Priority Data

Nov. 27, 2008  (JP) ................................ 2008-302891

(51) Int. Cl.
*H01J 3/14* (2006.01)
*H01J 27/00* (2006.01)
*H01L 31/0232* (2014.01)
*G02B 3/08* (2006.01)
*G02B 3/00* (2006.01)
*G02B 5/18* (2006.01)
*H01L 27/146* (2006.01)

(52) U.S. Cl.
CPC ..... *H01L 27/14627* (2013.01); *H01L 27/14685* (2013.01); *G02B 3/08* (2013.01); *G02B 3/0006* (2013.01); *G02B 5/1809* (2013.01)
USPC ......... 250/216; 250/226; 250/208.1; 257/432

(58) Field of Classification Search
CPC ...... G02B 3/00; G02B 3/0037; G02B 3/0043; G02B 3/0056; G02B 1/002; H04N 5/225; H04N 3/14; H04N 5/335; H01L 27/14625; H01L 27/14627; H01L 27/1446; H01L 31/0232; H01L 31/02327
USPC ............... 250/216, 208.1, 239, 226; 257/428, 257/431, 432, 433, 434, 440, 443, 451, 257/461; 348/340, 272, 273, 276, 277, 348/278–281, 294, 335, 336; 359/742
See application file for complete search history.

(56) References Cited

U.S. PATENT DOCUMENTS 7,068,432 B2 *   6/2006   Boettiger et al. ............. 359/619
7,238,960 B2 *   7/2007   Sundaram et al. ............. 257/21

(Continued)

FOREIGN PATENT DOCUMENTS

| JP | 63-039009 | 2/1988 |
|---|---|---|
| JP | 2001-108812 | 4/2001 |
| JP | 2005-026567 A | 1/2005 |
| JP | 2006-351972 | 12/2006 |
| JP | 2008-107394 A | 5/2008 |
| JP | 2009-266900 A | 11/2009 |

OTHER PUBLICATIONS

Japanese Office Action issued Apr. 23, 2013 for corresponding Japanese Application No. 2008-302891.

*Primary Examiner* — Que T Le
*Assistant Examiner* — Jennifer Bennett
(74) *Attorney, Agent, or Firm* — Rader, Fishman & Grauer PLLC

(57) ABSTRACT

A two-dimensional solid-state image pickup device includes a plurality of pixel regions arranged in a two-dimensional matrix in X and Y directions. Each of the pixel regions includes at least a light-receiving element, and a light-condensing element. The light-condensing element is a sub-wavelength lens including protrusions each having a size equivalent to or smaller than a wavelength of an electromagnetic wave incident on the light-receiving element. Each of the protrusions has a rounded edge.

28 Claims, 13 Drawing Sheets

(56) References Cited

U.S. PATENT DOCUMENTS

| | | | |
|---|---|---|---|
| 7,250,591 B2* | 7/2007 | Mouli | 250/208.1 |
| 7,646,551 B2* | 1/2010 | Li et al. | 359/741 |
| 2005/0121599 A1* | 6/2005 | Mouli | 250/208.1 |
| 2006/0125948 A1* | 6/2006 | Orita et al. | 348/340 |
| 2006/0284052 A1 | 12/2006 | Toshikiyo et al. | |
| 2006/0285228 A1* | 12/2006 | Ishii et al. | 359/742 |
| 2007/0035844 A1* | 2/2007 | Li et al. | 359/619 |
| 2007/0146531 A1* | 6/2007 | Toshikiyo | 348/340 |
| 2007/0171120 A1* | 7/2007 | Puscasu et al. | 342/53 |
| 2008/0011937 A1* | 1/2008 | Toshikiyo | 250/208.1 |

* cited by examiner

Y DIRECTION
X DIRECTION

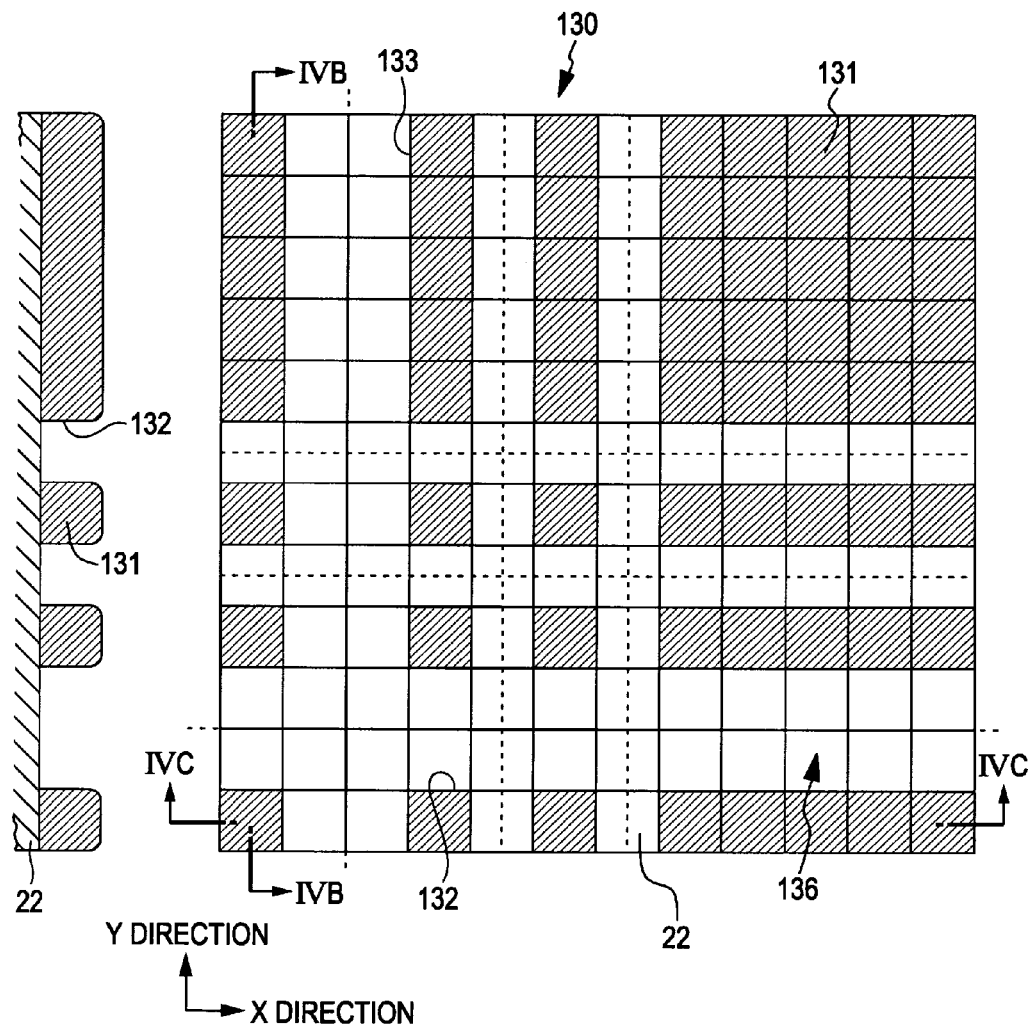

TWO DIMENSIONAL SOLID-STATE IMAGE PICKUP DEVICE WITH A LIGHT CONDENSING ELEMENT INCLUDING PROTRUSIONS SEPARATED BY RECESSES

BACKGROUND OF THE INVENTION

1. Field of the Invention

The present invention relates to a two-dimensional solid-state image pickup device.

2. Description of the Related Art

Since a design rule of a semiconductor manufacturing process has been improved and the number of pixels in a solid-state image pickup device has been increased, miniaturization of the size of a pixel has been progressed. In a solid-state image pickup device, a plurality of pixel regions are arranged in a two-dimensional matrix in X and Y directions. Each pixel region includes at least a light-receiving element. Now, the size of a single pixel region is substantially twice a visible wavelength. In such a solid-state image pickup device, a single pixel region has a smaller physical size than an Airy disk, which is a diffraction limit of a lens optical system.

As a light-condensing element which efficiently guides light to a pixel region, an on-chip micro convex lens is typically used. Unfortunately, the on-chip micro convex lens has a low light-condensing efficiency for light being obliquely incident on the light-condensing element. Hence, the relative positional relationship between the light-receiving element and the on-chip micro convex lens in a pixel region at a center portion of the solid-state image pickup device is changed from that in a pixel region at a peripheral portion of the solid-state image pickup device. In particular, the position at which an optical axis of the on-chip micro convex lens passes through the light-receiving element is changed (for example, see Japanese Unexamined Patent Application Publication No. 63-39009).

When the size of the pixel region is decreased, the on-chip micro convex lens should have a processing accuracy at the sub-micrometric scale. However, it is extremely difficult to highly accurately fabricate an on-chip micro convex lens having a small focal length and a large curvature by an existing method, i.e., by melting a resist material through thermal reflowing, and using a surface tension of the resist material to form the on-chip micro convex lens. Since the forming method uses the surface tension, it is difficult to form a structure other than a spherical structure.

A light-condensing element formed of a sub-wavelength lens (SWLL) having a periodic structure at a physical scale, which is smaller than a wavelength of an electromagnetic wave (for example, visible light) incident on a light-receiving element, attracts an attention as a technique which can efficiently condense light even with a very small pixel region and which can be freely designed (for example, see Japanese Unexamined Patent Application Publication No. 2001-108812). Herein, a sub-wavelength is a region equivalent to or smaller than a wavelength of an electromagnetic wave as a subject. A sub-wavelength lens has a high light-condensing characteristic within a large incidence angle range. Thusly, the sub-wavelength lens has an excellent characteristic for obliquely incident light. For example, a sub-wavelength lens disclosed in Japanese Unexamined Patent Application Publication No. 2006-351972 has a concentric structure in each of pixel regions. When the sub-wavelength lens is applied to a solid-state image pickup device which is suitable for use with visible light, a technique has to be provided for highly accurately fabricating a structure at a smaller space scale than a wavelength of visible light. For example, the wavelength of visible light may be in a range of from about 400 to 700 nm. Thus, it is necessary to form a structure with at least a size in a range of from 100 to 200 nm.

SUMMARY OF THE INVENTION

To efficiently condense an electromagnetic wave with a sub-wavelength lens, it is important that a refractive index of the sub-wavelength lens spatially smoothly varies when viewed from the electromagnetic wave (for example, visible light). Regarding the sub-wavelength lens disclosed in Japanese Unexamined Patent Application Publication No. 2006-351972, a complicated structure such as a concentric structure is provided at each pixel region. Hence, micro-processing is difficult, and the actually attained processing accuracy is about 100 nm, the value which is not sufficiently small with respect to the wavelength of the visible light. In light of this, to prevent a light-condensing performance from being degraded, a structure is provided, which combines light condensing with geometrical optics (Fresnel lens) and light condensing with wave optics (sub-wavelength lens). With the structure, the light-condensing performance can be enhanced. At the same time, since a step structure is provided in a depth direction of the light-condensing element, complex scattering and reflection may occur. Also, in the case of the concentric structure, the refractive index may only slightly vary in a tangential direction of each concentric circle. Consequently, an effective difference may appear between an electromagnetic wave polarized in the tangential direction and an electromagnetic wave polarized in a direction orthogonal to the tangential direction. This difference may result in the light-condensing characteristic being degraded.

Accordingly, it is desirable to provide a two-dimensional solid-state image pickup device including a sub-wavelength lens having a structure in which a refractive index spatially smoothly varies when viewed from an incident electromagnetic wave (for example, visible light).

A two-dimensional solid-state image pickup device according to a first embodiment of the present invention includes a plurality of pixel regions arranged in a two-dimensional matrix in X and Y directions. Each of the pixel regions includes at least a light-receiving element, and a light-condensing element. The light-condensing element is a sub-wavelength lens including protrusions (column portions) each having a size equivalent to or smaller than a wavelength of an electromagnetic wave incident on the light-receiving element. Each of the protrusions (column portions) has a rounded edge.

A two-dimensional solid-state image pickup device according to a second embodiment of the present invention includes a plurality of pixel regions arranged in a two-dimensional matrix in X and Y directions. Each of the pixel regions includes at least a light-receiving element, and a light-condensing element. The light-condensing element is a sub-wavelength lens including recesses (holes) each having a size equivalent to or smaller than a wavelength of an electromagnetic wave incident on the light-receiving element. Each of the recesses (holes) has a rounded edge.

Reflection of an electromagnetic wave depends on a difference between refractive indices of two substances with an interface arranged therebetween. With the two-dimensional image solid-state image pickup device according to any of the first and second embodiments, the protrusion of the light-condensing element of the sub-wavelength lens has the rounded edge portion, or the recess has the rounded edge portion. Hence, the degree of the variation in composite refractive index (differential coefficient) in a propagating direction (Z direction in a general view) of an incident wave can be smoothened. Consequently, a reflection component at the surface of the light-condensing element can be reduced, and the electromagnetic wave can be efficiently condensed to the light-receiving element.

BRIEF DESCRIPTION OF THE DRAWINGS

FIG. 4A is a plan layout view schematically showing a light-condensing element of the two-dimensional solid-state image pickup device according to Embodiment 1 shown in FIG. 1B or 2B, and FIGS. 4B and 4C are cross-sectional conceptual diagrams schematically showing the light-condensing element respectively taken along arrows IVB-IVB and IVC-IVC in FIG. 4A;

DESCRIPTION OF THE PREFERRED EMBODIMENTS

Figure 1A:
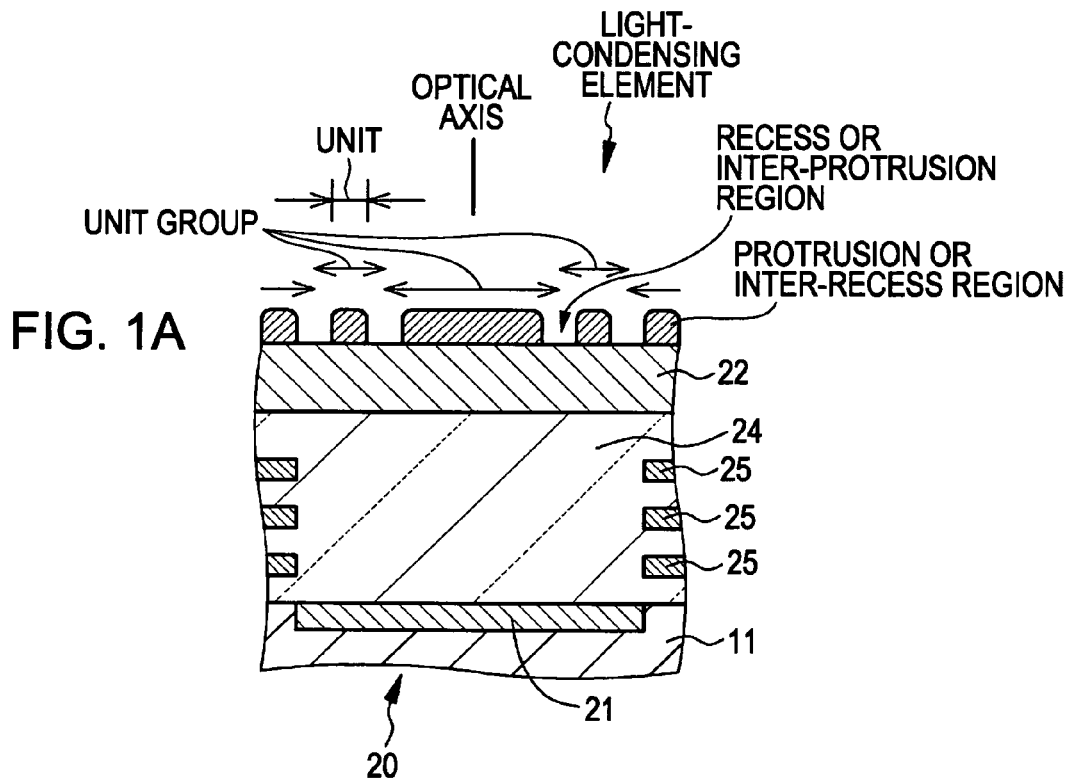
FIGS. 1A and 1B are partial cross-sectional views each schematically showing a two-dimensional solid-state image pickup device of front-surface irradiation type according to any of Embodiments 1 to 4.

Embodiments of the present invention will be described below with reference to the attached drawings. However, the present invention is not limited to the embodiments, and various numerical values and materials provided in the embodiments are merely exemplary provided. The description will be given in the order listed below.

1. Description for overview of a two-dimensional solid-state image pickup device according to embodiments of the present invention
2. Description for principle of a light-condensing element in the two-dimensional solid-state image pickup device according to embodiments of the present invention
3. Embodiment 1 (specific description of the two-dimensional solid-state image pickup device according to the embodiments of the present invention)
4. Embodiment 2 (modification of the two-dimensional solid-state image pickup device of Embodiment 1)
5. Embodiment 3 (another modification of the two-dimensional solid-state image pickup device of Embodiment 1)
6. Embodiment 4 (still another modification of the two-dimensional solid-state image pickup device of Embodiment 1)
7. Others

[Description for Overview of a Two-Dimensional Solid-State Image Pickup Device According to Embodiments of the Present Invention]

In a two-dimensional solid-state image pickup device according to a first embodiment of the present invention, a space between protrusions may be filled with a substance (referred to as "filler substance" for the convenience of description) having a refractive index $n_f$ which is different from a refractive index $n_0$ of a material of a light-condensing element. Also, in a two-dimensional solid-state image pickup device according to a second embodiment of the present invention, a recess may be filled with a substance (filler substance) having a refractive index $n_f$ which is different from a refractive index $n_0$ of a material of a light-condensing element. For example, the filler substance may be air (refractive index: 1.00) or an optical material having a low refractive index, such as $SiO_2$ or $MgF_2$. Alternatively, the filler substance may be selected from substances which satisfy an expression $n_0 - n_f \geq 0.5$. The filled state of the space between the protrusions or the recess with the filler substance may vary depending on the position of a pixel region in the two-dimensional solid-state image pickup device. A space between recesses is occupied by the optical material of the light-condensing element. In the following description, the space between the protrusions may be referred to as "inter-protrusion region" for the convenience of description, and a part of the light-condensing element between the recesses may be referred to as "inter-recess region" for the convenience of description.

In the two-dimensional solid-state image pickup device according to the first embodiment of the present invention, which includes the above-described preferred arrangement, the protrusions may be separated by grooves extending linearly in the X and Y directions. In this case, a groove at a light-condensing element in a pixel region may continuously extend to a groove at a light-condensing element in an adjacent pixel region. With this configuration, the grooves can be easily formed. Alternatively, the protrusions may be separated by grooves extending linearly in directions which are rotated by a desired angle from the X and Y directions. For example, the desired angle may be ±30, ±45, or ±60 degrees with reference to the X direction. For another example, the desired angle may be defined by a line connecting the two-dimensional solid-state image pickup device and the center of a pixel region, and the X direction. For still another example, a plurality of pixel regions may be divided into groups, and then the desired angle may be defined by a line connecting the center of the grouped pixel regions and a center portion of the two-dimensional solid-state image pickup device, and the X direction. Still alternatively, the protrusions may be separated by grooves extending linearly in the X and Y directions and grooves extending linearly in the directions which are rotated by the desired angle from the X and Y directions. The desired angle may be constant, or may vary in accordance with a position at which a pixel region is located in the two-dimensional solid-state image pickup device. When the light-condensing element is formed by the combination of the linearly extending grooves, variation in characteristics of light-condensing elements in neighboring pixel regions can be reduced as compared with the technique of the related art in which micro-processing is applied individually to the pixel regions.

In the two-dimensional solid-state image pickup device according to the second embodiment of the present invention, which includes the above-described preferred arrangement, the recesses may be arranged in the X and Y directions. Alternatively, the recesses may be arranged at vertexes of a virtual equilateral triangle, square, or regular hexagon. Still alternatively, the recesses may be arranged regularly or irregularly. When the recesses are irregularly arranged, an in-plane distribution variation component of systematic recesses can be reduced, and a systematic error can be reduced. For example, when focal lengths are finely adjusted individually for light-receiving elements to maximally increase detection efficiency for different wavelength (color) components, a plane density distribution of recesses may vary. Hence, the design can be freely determined. The light-condensing element may be formed of a sub-wavelength lens having recesses each of which has a size equivalent to or smaller than a wavelength of an electromagnetic wave incident on the light-receiving element. The density of the recesses may be decreased toward the center of the light-condensing element, or the density of the recesses may be decreased toward an edge portion of the light-condensing element.

In the two-dimensional solid-state image pickup device according to the first embodiment of the present invention, which includes the above-described preferred arrangement and configuration, when the wavelength of the electromagnetic wave incident on the light-receiving element is $\lambda_0$ (nm) and the refractive index of the material of the light-condensing element is $n_0$, though it is not limited thereto, a unit of a size of each of the protrusions and a unit of a distance between the protrusions (length of the inter-protrusion region) may be desirably expressed as follows, $L_{unit} \equiv \lambda_0/(p \cdot n_0)$, where p is a positive number. That is, the size of each of the protrusions, and the distance between the protrusions (length of the inter-protrusion region) may be desirably expressed as follows, $q \cdot \lambda_0/(p \cdot n_0)$. In the two-dimensional solid-state image pickup device according to the second embodiment of the present invention, which includes the above-described preferred arrangement and configuration, when the wavelength of the electromagnetic wave incident on the light-receiving element is $\lambda_0$ (nm) and the refractive index of the material of the light-condensing element is $n_0$, though it is not limited thereto, a unit of a size of each of the recesses and a unit of a distance between the recesses (length of the inter-recess region) may be desirably expressed as follows, $L_{unit} \equiv \lambda_0/(p \cdot n_0)$, where p is a positive number. That is, the size of each of the recesses, and the distance between the recesses (length of the inter-recess region) may be desirably expressed as follows, $q \cdot \lambda_0/(p \cdot n_0)$.

In the two-dimensional solid-state image pickup device according to any of the first and second embodiments of the present invention, which include the above-described preferred arrangements and the configurations, the light-condensing element is fabricated by an optically transparent material to an electromagnetic wave to which the light-receiving element is sensitive. In particular, the light-condensing element may be made of silicon, silicon oxide (including silicon oxide containing impurity such as boron or phosphorus), spin-on-glass (SOG), silicon nitride, silicon oxynitride, titanium oxide, zirconium oxide, niobium oxide, tantalum oxide, a compound semiconductor (for example, GaAs, GaN, InP), a carbon compound (for example, silicon carbide), or an organic compound (for example, benzocyclobutene resin, polymethyl methacrylate (PMMA) resin, polyamide resin, polyimide resin, or various curable resin including photo-curable resin, UV-curable resin, and electron-beam-curable resin).

Alternatively, in the two-dimensional solid-state image pickup device according to any of the first and second embodiments of the present invention, which include the above-described preferred arrangements and the configurations, the light-condensing element may be made of a material having a refractive index which is periodically variable along a normal direction of the light-receiving element. For example, the light-condensing element may be made of a laminated material or a multilayer film, in particular, a photonic crystal, in which a low-refractive-index material (e.g., $SiO_2$ or $MgF_2$) and a high-refractive-index material (e.g., a semiconductor material such as Si or Ge, or an oxide or nitride, such as $TiO_2$, $Ta_2O_5$, or SiN) are layered on one another. When the photonic crystal, in which the optical materials with different, periodically variable refractive indices in a Z direction are layered with a half-wavelength period of an electromagnetic wave of light, a spectral performance in a wavelength direction of the electromagnetic wave in the Z direction can be provided, and a light-condensing performance can be provided by using a refractive-index distribution in an XY plane. Thus, the light-condensing element having a color-separating filter can be provided.

In the two-dimensional solid-state image pickup device according to any of the first and second embodiments of the present invention, which include the above-described preferred arrangements and the configurations, an optical axis of a light-condensing element in a pixel region located at a center portion or close to the center portion of the two-dimensional solid-state image pickup device may pass through the center of the pixel region. (The optical axis of the light-condensing element is the optical center of the light-condensing element, and corresponds to a normal line of the light-condensing element passing through the focal point of the light-condensing element. The optical center typically has a high composite refractive index. This can be applied to the following description.) An optical axis of a light-condensing element in a pixel region located at a peripheral portion of the two-dimensional solid-state image pickup device may pass through a part deviated from the center of the pixel region. In particular, the light-condensing element in the pixel region located at the peripheral portion of the two-dimensional solid-state image pickup device is offset with respect to the light-receiving element. Accordingly, pupil correction is carried out, and the obliquely incident electromagnetic wave (for example, light) can be efficiently guided to the light-receiving element. The composite refractive index will be described later.

Herein, a value P is controlled to a limit of a processing dimension in a manufacturing process of the light-condensing element. When a single pixel region has an area of $S_{pixel}$, the single pixel region can be divided into units of ($S_{pixel}/$ $L_{unit}^2$). Also, a value of q varies depending on the position of a unit in a single pixel region. Values of q in the X and Y directions may be equivalent to each other, or may be different from each other. Herein, the protrusion and the inter-recess region each are formed of a unit group including $X_0$ units in the X direction and $Y_0$ units in the Y direction. When electromagnetic waves with a plurality of wavelengths are incident on the light-receiving element, or when an electromagnetic wave being incident on the light-receiving element has a continuous spectrum, a wavelength of a proper electromagnetic wave may be determined to $\lambda_0$.

The protrusion may have a cross section of a square or a rounded square along the XY plane. However, it is not limited thereto. The protrusion may have any cross section. For example, the protrusion may have a cross section of a rectangular, a rounded rectangular, a regular polygon, a rounded regular polygon, a circle, an ellipse, or an elongated circle. When the protrusion has a cross section of a shape other than a square, a virtual square occupying the same area as that of the cross section may be assumed, and a side of the virtual square may correspond to the size of each of the protrusions. The distance between the protrusions (inter-protrusion region) is the shortest distance in a space between the protrusions. The recess may have a cross section of a circle along the XY plane. However, it is not limited thereto. The recess may have any cross section. When the recess has a cross section of a shape other than a circle, a virtual circle occupying the same area as that of the cross section may be assumed, and a diameter of the virtual circle may correspond to the size of each of the recesses. The distance between the recesses (inter-recess region) is the shortest distance in a space between the recesses.

In the two-dimensional solid-state image pickup device (hereinafter, also merely referred to as "device") according to any of the first and second embodiments of the present invention, which include the above-described preferred arrangements and the configurations, the electromagnetic wave may be visible light, infrared rays, or ultraviolet rays. The pixel region includes at least a light-receiving element. In particular, the pixel region may include a single light-receiving element, four (2×2=4) light-receiving elements, nine (3×3=9) light-receiving elements, or seven light-receiving elements at the center and vertexes of a regular hexagon.

The device may be a solid-state image pickup device, such as a CCD image sensor or a CMOS image sensor. The device may be front-surface irradiation type or back-surface irradiation type. The device may include a filter. The filter may be a color filter. The color filter may transmit a specific wavelength of any of, for example, red, green, blue, cyan, magenta, or yellow. Alternatively, the filter may be made of an organic or inorganic material which cuts a specific wavelength. The filter may be made of a photonic crystal, a conductive grid (diffraction grating made of metal, which functions as a filter for transmitting light with a specific wavelength because a grating interval substantially corresponds to a wavelength of visible light), or a thin film made of an inorganic material such as amorphous silicon. When the color filter is not used for color separation, or when the light-receiving element itself is sensitive to a specific wavelength, a filter may be omitted.

In the device, the light-condensing element is the sub-wavelength lens including the protrusions each having the size equivalent to or smaller than the wavelength of the electromagnetic wave incident on the light-receiving element, the protrusions are separated by the grooves extending linearly in the two directions, and the groove at the light-condensing element in the pixel region continuously extends to the groove at the light-condensing element in the adjacent pixel region.

Hence, the light-condensing element can be fabricated by the following method. In a first patterning step, the grooves extending linearly in one direction are formed by lithography and etching. In a second patterning step, the grooves extending linearly in the other direction are formed by lithography and etching. With the method, the protrusions can be highly accurately formed, and hence, variation in the angle defined by the side surfaces, which are orthogonal to one another, of the protrusions can be prevented from appearing. The variation in characteristic of the light-condensing element and the variation in quality can be prevented from appearing. Alternatively, the light-condensing element having a sub-wavelength structure may be formed by micro-processing with an extremely short pulse laser such as a femtosecond laser. Still alternatively, the light-condensing element having a sub-wavelength structure may be formed by nano-imprinting.

In the device, the edge portion of the protrusion or the recess (edge portion defined by a tip surface and a side surface of the protrusion, or edge portion defined by a side surface of the recess and a top surface of the inter-recess region) is rounded. For example, the edge portion may be provided by forming the protrusion or the recess by anisotropic etching and then by applying isotropic etching, such as plasma etching or wet etching. Otherwise, to obtain the rounded edge portion, for example, a structure preliminarily having a curvature may be formed by electron beam lithography or nano-imprinting.

[Description for Principle of a Light-Condensing Element in the Two-Dimensional Solid-State Image Pickup Device According to Embodiments of the Present Invention]

The light-condensing principle of the light-condensing element will be briefly described below according to embodiments. Herein, for example, an electromagnetic wave has a wavelength of 500 nm (substantially green light). In this case, the diffraction limit of the electromagnetic wave has a spread of about 500 nm. For a structure having a smaller physical size than 500 nm, the electromagnetic wave is not able to spatially resolve the structure. For example, assuming a combination of a light-condensing element made of an optical material (SiN) having a refractive index of $n_0=2.00$ and a filler substance (air) having a refractive index of $n_f=1.00$, a unit group $(X_j, Y_j)$ having a value $X_j$ in the X direction and a value $Y_j$ in the Y direction has a composite refractive index $n(X_j, Y_j)$ in which the refractive index $n_0$ of the material of the protrusions is mixed with the refractive index $n_f$ of the filler substance. That is, the composite refractive index $(X_j, Y_j)$ can be approximated to a ratio of a volume of the protrusions to a volume of the space, which occupy the unit group $(X_j, Y_j)$. Accordingly, in a unit group $(X_j, Y_j)$ in which the ratio of the filler substance (air) is large, the composite refractive index $n(X_j, Y_j)$ is relatively small, and hence the electromagnetic wave propagates at a speed similar to light speed. In contrast, in a unit group $(X_j, Y_j)$ in which the ratio of the protrusions is large, the composite refractive index $n(X_j, Y_j)$ is relatively large, and hence the electromagnetic wave propagates at a speed similar to light speed/$n_0$.

Figure 12:
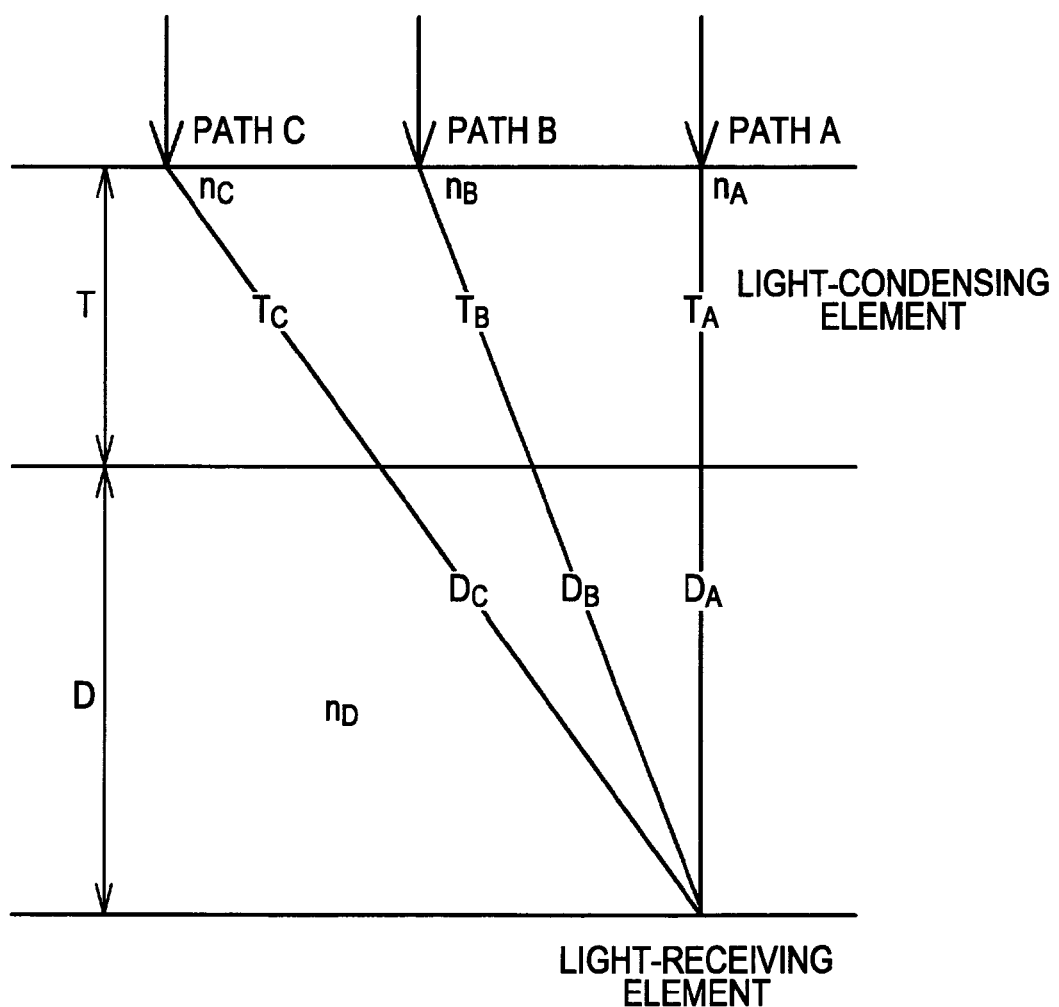
FIG. 12 is a conceptual diagram showing a cross section of a light-condensing element etc. to explain a condition to be satisfied by the light-condensing element.

FIG. 12 conceptually shows a condition to be satisfied by the light-condensing element. FIG. 12 corresponds to a pixel region in FIG. 1A or 2A, which will be described later. To condense an electromagnetic wave propagating through the center of the light-condensing element (path A), an electromagnetic wave propagating through a part deviated from the center of the light-condensing element (path B), and an electromagnetic wave propagating through a edge portion of the light-condensing element (path C), at a single point, propagation times of the electromagnetic waves propagating respectively in the paths have to be the same. It is to be noted that the illustrated paths are provided merely for the easier description.

Herein, it is assumed that $n_A$, $n_B$, and $n_C$ are composite refractive indices $n(X_j, Y_j)$ of unit groups $(X_j, Y_j)$ of the respective paths, and $n_D$ is a refractive index in a region closer to the light-receiving element than the light-condensing element. Also, T is a thickness of the light-condensing element, $T_A$, $T_B$, and $T_C$ are optical path lengths of the respective paths of light in the light-condensing element, and $D_A$, $D_B$, and $D_C$ are optical path lengths of the paths of the light exited from the light-condensing element. Further, c is the light speed. These values have to satisfy the following expressions. It is to be noted that $V_A$, $V_B$, $V_C$, and $V_D$ are a speed of the electromagnetic wave in the path A in the light-condensing element, a speed of the electromagnetic wave in the path B in the light-condensing element, a speed of the electromagnetic wave in the path C in the light-condensing element, and a speed of the electromagnetic wave of light in a path exited from the light-condensing element.

$$T_A/V_A + D_A/V_D = T_B/V_B + D_B/V_D \qquad (1)$$
$$= T_C/V_C + D_C/V_D$$

also, $$V_A = c/n_A \qquad (2\text{-}1)$$
$$V_B = c/n_B \qquad (2\text{-}2)$$
$$V_C = c/n_C \qquad (2\text{-}2)$$
$$V_D = c/n_D \qquad (2\text{-}4)$$

By substituting Expressions (2-1), (2-2), (2-3), and (2-4) into Expression (1), Expression (3) can be obtained.

$$T_A \cdot n_A + D_A \cdot n_D = T_B \cdot n_B + D_B \cdot n_D \qquad (3)$$
$$= T_C \cdot n_C + D_C \cdot n_D$$

By approximately obtaining the refractive-index distribution satisfying Expression (3), i.e., by determining the composite refractive index $n(X_j, Y_j)$ in the unit group $(X_j, Y_j)$, the light-condensing element can condense light onto one point.

Figure 13:
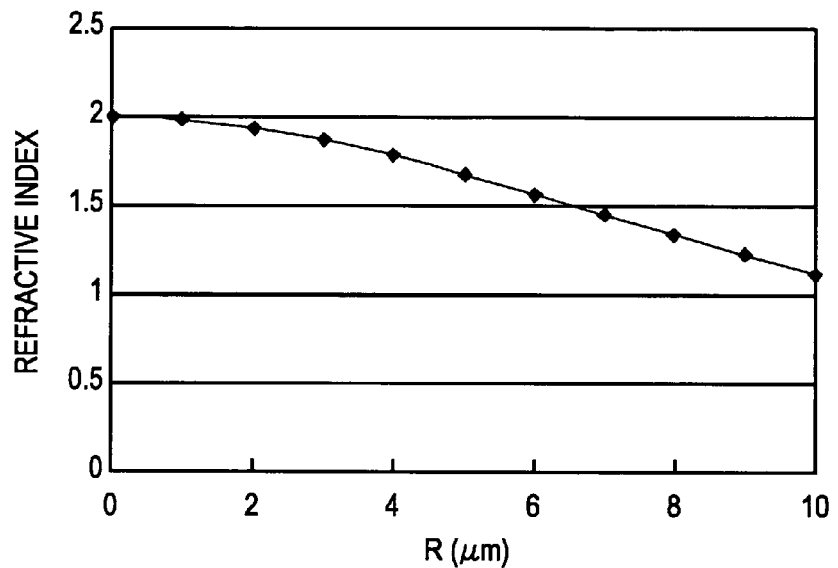
FIG. 13 is a graph showing a distribution of refractive indices so that parallel light is focused.

FIG. 13 illustrates an example of variation in refractive index. It is assumed that the pixel region has a size of 20 μm, a distance from the light-condensing element to the focal point is 10 μm, and the light-condensing element has a thickness of 10 μm. FIG. 13 illustrates variation in refractive index from the center to the edge portion of the pixel region. The refractive-index distribution so that parallel light is focused on a point is shown in FIG. 13. Since the center (R=0 μm) of the light-condensing element has a refractive index of about 2.00, the ratio of the protrusions (or inter-recess regions) may be determined substantially 100%. In contrast, the refractive index at the edge portion (R=10 μm) of the pixel region should be decreased to about 1.2. To obtain such composite refractive index $n(X_j, Y_j)$, in the unit group $(X_j, Y_j)$, the volume ratio of the protrusions (or inter-recess regions) may be 20%, whereas the volume ratio of the recesses (inter-protrusion regions, that is, the volume ratio of the filler substance or air) may be 80%. That is, the composite refractive index $n(X_j, Y_j)$ is expressed as follows, $n(X_j, Y_j)=2.00\times0.8+1.00\times0.2=1.20$. As described above, the composite refractive index $n(X_j, Y_j)$ of the unit group $(X_j, Y_j)$ can be obtained by combining the protrusions, the inter-protrusion regions, the recesses, and the inter-recess regions. The refractive-index distribution which approximately reproduces the above-mentioned relationship can be obtained. However, in the actual situation, the focus does not have to be strictly made at a single point because a single pixel region has a limited area. For adjustment of the incidence angle, the thickness T of the light-condensing element, the distance D from the light-condensing element to the light-receiving element, and the spatial distribution of the composite refractive indices shown in FIG. 12 are adjusted. Accordingly, a desired incidence angle condition can be obtained.

In addition, the edge portion of the protrusion or the recess of the light-condensing element, which is the sub-wavelength lens, is rounded. That is, the volume ratio of the protrusions (or inter-recess regions), or the volume ratio of the recesses (or inter-protrusion regions) are smoothly increased in the propagating direction of the incidence wave (in Z direction in a general view). Hence, the degree of the variation in composite refractive index (differential coefficient) can be smoothened. Consequently, a reflection component at the surface of the light-condensing element can be reduced, and the electromagnetic wave can be efficiently condensed.

[Embodiment 1]

Figure 1B:
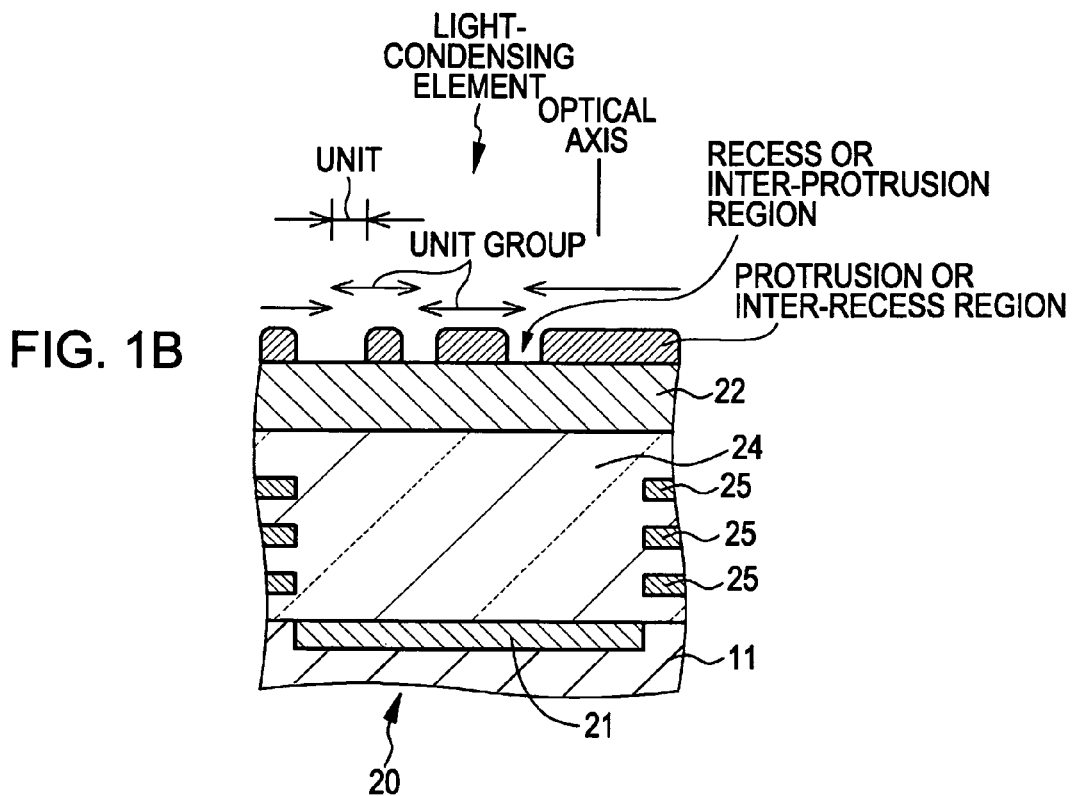
Figure 2A:
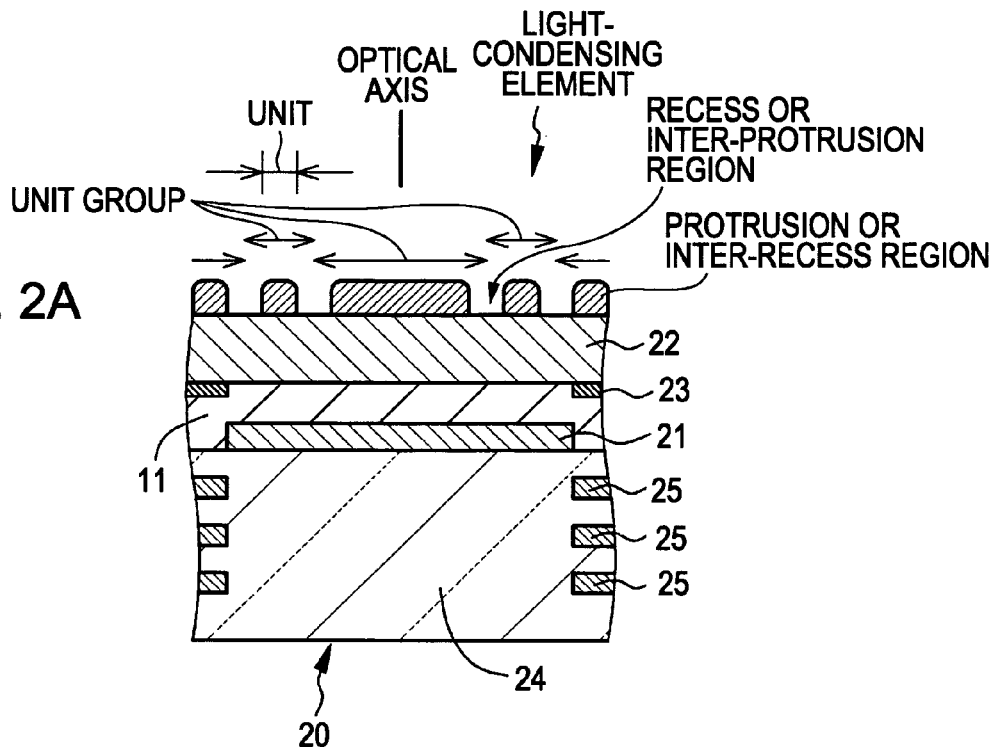
FIGS. 2A and 2B are partial cross-sectional views each schematically showing a two-dimensional solid-state image pickup device of back-surface irradiation type according to any of Embodiments 1 to 4.
Figure 2B:
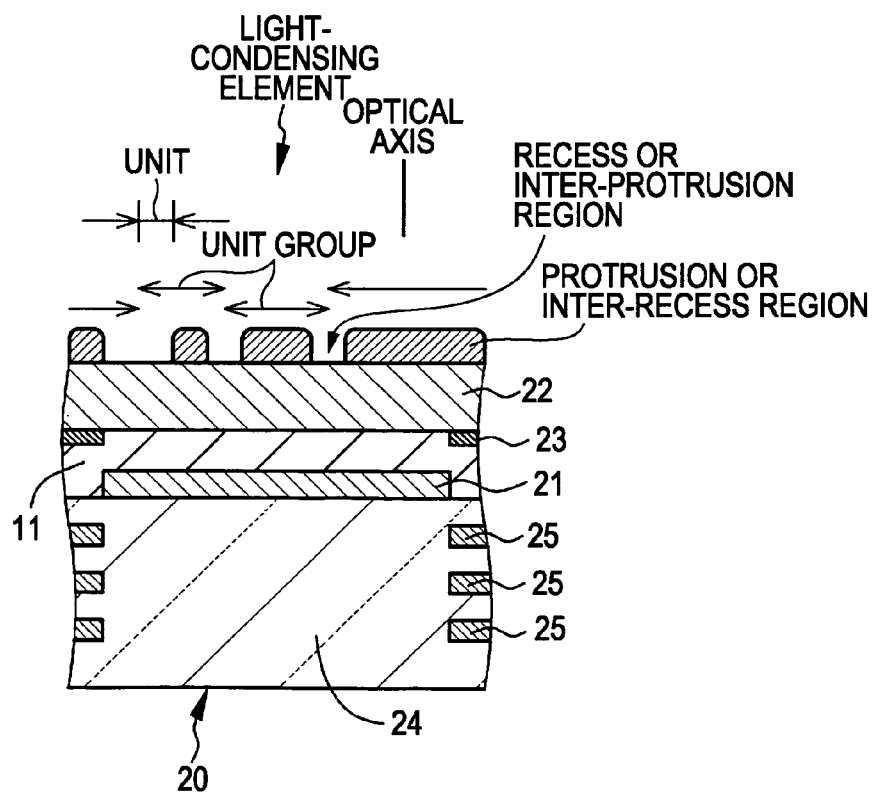

Embodiment 1 relates to the two-dimensional solid-state image pickup device according to the first embodiment of the present invention. FIGS. 1A, 1B, 2A, and 2B are partial cross-sectional views schematically showing two-dimensional solid-state image pickup devices according to Embodiments 1 to 4. More specifically, FIGS. 1A, 1B, 2A, and 2B are partial cross-sectional views each schematically showing a single pixel region of an image sensor of electric field amplification type (CMOS image sensor) which serves as a solid-state image pickup device. FIGS. 1A and 2A show pixel regions located at center portions of the two-dimensional solid-state image pickup devices. FIGS. 1B and 2B show pixel regions located at peripheral portions of the two-dimensional solid-state image pickup devices. That is, in the pixel region shown in FIGS. 1A and 2A, light is incident perpendicularly to the pixel region. In the pixel region shown in FIGS. 1B and 2B, light is incident obliquely to the pixel region. The two-dimensional solid-state image pickup device shown in FIGS. 1A and 1B is the two-dimensional solid-state image pickup device of front-surface irradiation type. The two-dimensional solid-state image pickup device shown in FIGS. 2A and 2B is the two-dimensional solid-state image pickup device of back-surface irradiation type.

Figure 3B:
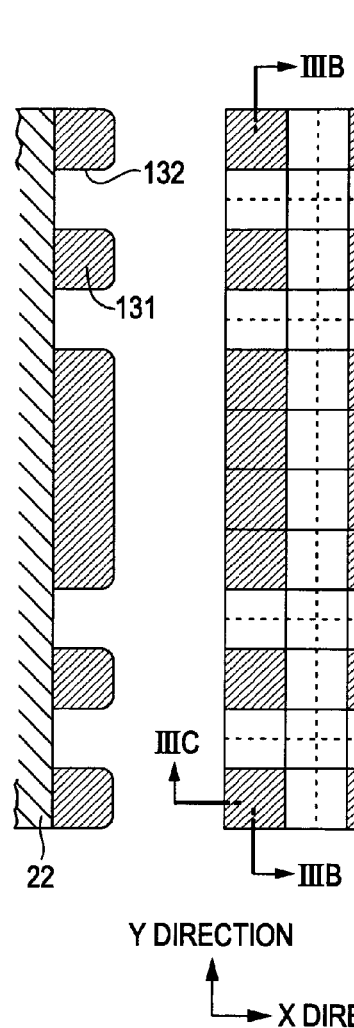
FIG. 3A is a plan layout view schematically showing a light-condensing element of the two-dimensional solid-state image pickup device according to Embodiment 1 shown in FIG. 1A or 2A, and FIGS. 3B and 3C are cross-sectional conceptual diagrams schematically showing the light-condensing element respectively taken along arrows IIIB-IIIB and IIIC-IIIC in FIG. 3A.
Figure 3A:
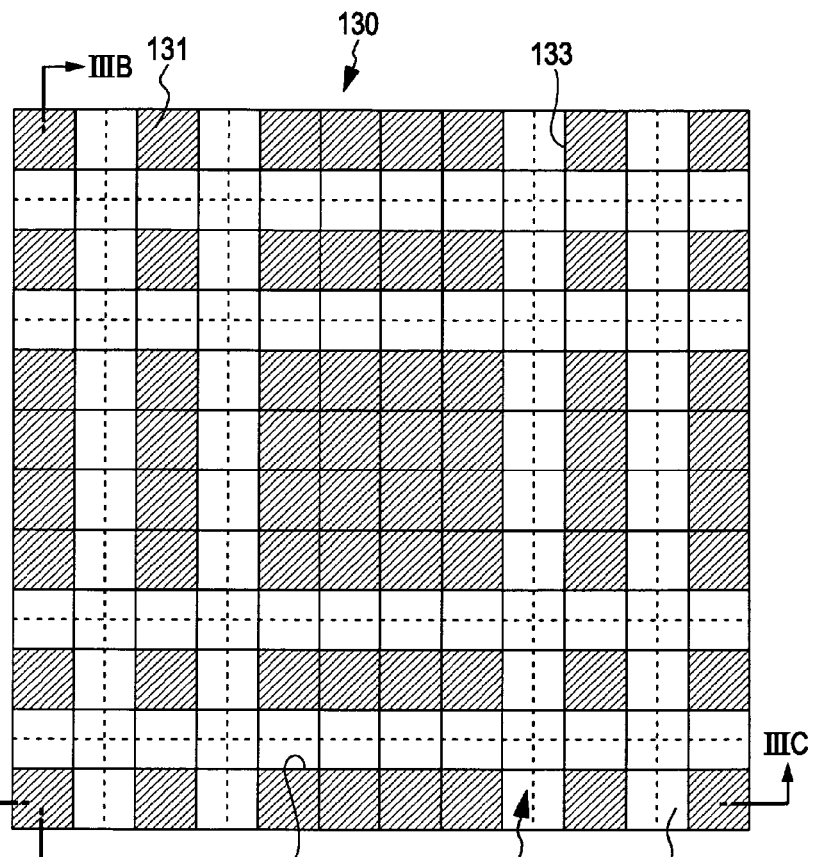
Figure 3C:
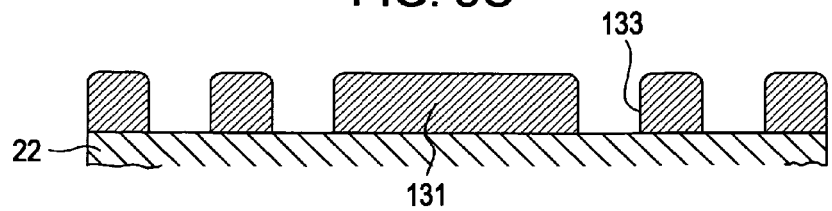

FIG. 3A is a plan layout view schematically showing a light-condensing element according to Embodiment 1. FIGS. 3B and 3C are cross-sectional conceptual diagrams schematically showing the light-condensing element respectively taken along arrows IIIB-IIIB and IIIC-IIIC in FIG. 3A. The light-condensing element shown in the plan layout view in FIG. 3A is included in the pixel region of the two-dimensional solid-state image pickup device shown in FIGS. 1A and 2A. FIG. 4A is a plan layout view schematically showing the light-condensing element according to Embodiment 1. FIGS. 4B and 4C are cross-sectional conceptual diagrams schematically showing the light-condensing element respectively taken along arrows IVB-IVB and IVC-IVC in FIG. 4A. The light-condensing element shown in the plan layout view in FIG. 4A is included in the pixel region of the two-dimensional solid-state image pickup device shown in FIGS. 1B and 2B.

The two-dimensional solid-state image pickup device according to Embodiment 1 or any of Embodiments 2 and 3 described later relates to the two-dimensional solid-state image pickup device according to the first embodiment of the present invention. A plurality of pixel regions 20 are arranged in a two-dimensional matrix in X and Y directions. Each pixel region 20 includes at least a light-receiving element 21 and a light-condensing element (light-condensing member). The light-condensing element is a sub-wavelength lens having protrusions each having a size equivalent to or smaller than a wavelength of an electromagnetic wave incident on the light-receiving element (or a size significantly smaller than the wavelength of the electromagnetic wave incident on the light-receiving element). Each protrusion (column portion) has a rounded edge portion.

In contrast, the two-dimensional solid-state image pickup device according to Embodiment 4 described later relates to the two-dimensional solid-state image pickup device according to the second embodiment of the present invention. A plurality of pixel regions 20 are arranged in a two-dimensional matrix in X and Y directions. Each pixel region 20 includes at least a light-receiving element 21 and a light-condensing element (light-condensing member). The light-condensing element is a sub-wavelength lens having recesses each having a size equivalent to or smaller than a wavelength of an electromagnetic wave incident on the light-receiving element (or a size significantly smaller than the wavelength of the electromagnetic wave incident on the light-receiving element). Each recess (hole portion) has a rounded edge portion.

In the two-dimensional solid-state image pickup device according to Embodiment 1 or any of Embodiments 2 to 4, the light-receiving element detects (receives), for example, visible light as the electromagnetic wave. In particular, the pixel region 20 includes the single light-receiving element 21. The pixel region 20 includes a color filter 22. In the two-dimensional solid-state image pickup device of the front-surface irradiation type shown in FIGS. 1A and 1B, the light condensed by the light-condensing element passes through the color filter 22 and a smoothing layer 24 and is guided to the light-receiving element 21. The smoothing layer 24 is made of a transparent substance, such as $SiO_2$ or SiN. The light is accumulated as charges through photoelectric conversion, and then the charges are read out as electric signals. Reference numeral 25 denotes wiring and 11 denotes a substrate formed of a silicon substrate. The light-receiving element 21 is formed in the substrate 11. In the two-dimensional solid-state image pickup device of the back-surface irradiation type shown in FIGS. 2A and 2B, the light condensed by the light-condensing element passes through the color filter 22, a substrate 11, an opening region of a light-shielding film 23 made of copper (Cu) or aluminum (Al), and is guided to the light-receiving element 21.

The light-condensing element according to Embodiment 1 or any of Embodiments 2 to 4 described later is made of, for example, an optical material such as SiN having a refractive index ($n_0$) of 2.00. In Embodiment 1 or any of Embodiments 2 and 3 described later, a space between the protrusions is filled with a filler substance having a refractive index $n_f$ which is different from the refractive index $n_0$ of the material of the light-condensing element. Specifically, the filler substance is air (refractive index: 1.00). In Embodiment 1 or any of Embodiments 2 and 3 described later, the protrusion has a cross section of a rounded square along the XY plane. In contrast, in Embodiment 4 described later, the recess is filled with a filler substance having a refractive index $n_f$ which is different from the refractive index $n_0$ of the material of the light-condensing element. Specifically, the filler substance is air (refractive index: 1.00). In Embodiment 4 described later, the recess has a cross section of a circle along the XY plane.

In Embodiment 1 or any of Embodiments 2 to 4 described later, when the wavelength of the electromagnetic wave incident on the light-receiving element 21 is $\lambda_0$ (nm) and the refractive index of the material of the light-condensing element is $n_0$, the unit of the size of each of the protrusions (or recess) and the unit of the distance between the protrusions (or recesses) (length of the inter-protrusion region or length of the inter-recess region) is desirably expressed as follows, $L_{unit} = \lambda_0/(p \cdot n_0)$, where p is a positive number. More specifically, the following expressions are provided.

$n_0 = 2.00$ $\lambda_0 = 500$ (nm)

$p = 5$ $L_{unit} = 50$ (nm)

In the light-condensing element according to Embodiment 1 or any of Embodiments 2 to 4 described later, the single pixel region 20 has a side of 2 μm. Since the expression $L_{unit} = 50$ nm is established, the single pixel region 20 is divided into units of 40×40=1600. Herein, a gap of 0.5 μm is provided between the pixel regions 20.

In the two-dimensional solid-state image pickup device according to Embodiment 1 or any of Embodiments 2 to 4 described later, as shown in FIG. 1A or 2A, the optical axis of the light-condensing element located at the center portion or close to the center portion of the two-dimensional solid-state image pickup device passes through the center of the pixel region 20. In the pixel region 20 shown in FIG. 1A or 2A, the density of the protrusions or the density of the inter-recess regions is high at a center portion of the pixel region 20. In contrast, as shown in FIG. 1B or 2B, the optical axis of the light-condensing element located at the peripheral portion of the two-dimensional solid-state image pickup device passes through a part deviated from the center of the pixel region 20. In the pixel region 20 shown in FIG. 1B or 2B, the density of the protrusions or the density of the inter-recess regions is high at the edge portion of the pixel region 20. The light-condensing element in the pixel region 20 located at the peripheral portion of the two-dimensional solid-state image pickup device is offset with respect to the light-receiving element. Accordingly, pupil correction is carried out, and the obliquely incident electromagnetic wave (for example, light) can be efficiently guided to the light-receiving element.

FIG. 3A is a plan layout view schematically showing the light-condensing element of the pixel region 20 shown in FIG. 1A or 2A. FIG. 4A is a plan layout view schematically showing the light-condensing element of the pixel region 20 shown in FIG. 1B or 2B. For the convenience of illustration, in FIGS. 3A and 4A, it is assumed that the single pixel region 20 is divided into units of 12×12=144. Also, in an example shown in FIG. 3A, a value $X_0$ is selected from 1.5, 2, and 5, and a value $Y_0$ is selected from 1.5, 2, and 5. That is, the nine combinations of $X_0$ and $Y_0$ may be provided as follows: $(X_0, Y_0)$=(1.5, 1.5), (2, 1.5), (5, 1.5), (1.5, 2), (2, 2), (5, 2), (1.5, 5), (2, 5), (5, 5). In an example shown in FIG. 4A, a value $X_0$ is selected from 2.5, 4.5, and 5, and a value $Y_0$ is selected from 2, 2.5, and 5.5. That is, the nine combinations of $X_0$ and $Y_0$ may be provided as follows: $(X_0, Y_0)$=(2.5, 2), (4.5, 2), (5.5, 2), (2.5, 2.5), (4.5, 2.5), (5.5, 2.5), (2.5, 5.5), (4.5, 5.5), (5.5, 5.5). In FIGS. 3A and 4A, the protrusions 131 are indicated by oblique lines and the boundaries of unit groups are indicated by dotted lines for clearly showing the protrusions 131. Also, in FIGS. 3B and 3C, and FIGS. 4B and 4C, the protrusions 131 are indicated by oblique lines for clearly showing the protrusions 131. Further, the boundaries of the units are indicated by solid lines for clearly showing the units. These indications are applied to other drawings. Each protrusion 131 has a rounded edge portion. The protrusion 131 has a column (pillar) structure. Reference numerals 136, 236, and 336 each denote a space between the protrusions (inter-protrusion region).

Figure 5:
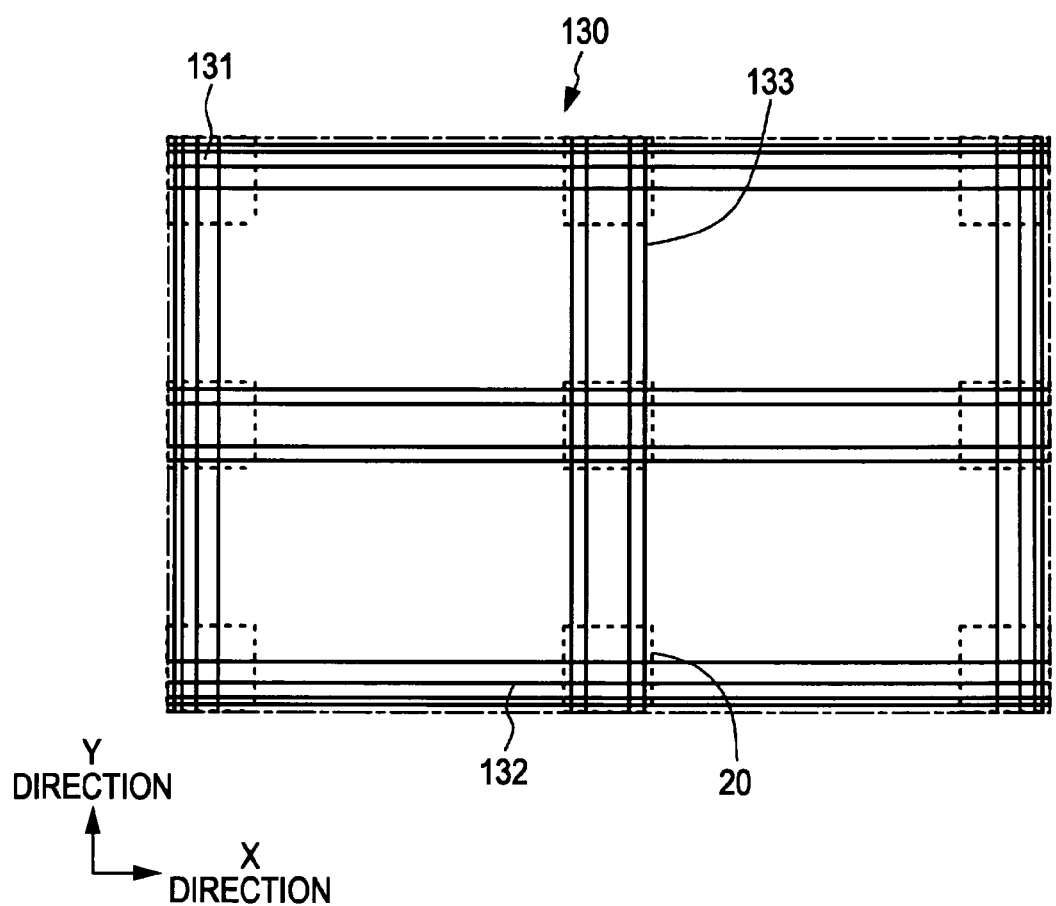
FIG. 5 schematically partly illustrates grooves formed in the light-condensing element of the two-dimensional solid-state image pickup device according to Embodiment 1.

In the two-dimensional solid-state image pickup device according to Embodiment 1, a light-condensing element 130 is the sub-wavelength lens including the protrusions 131 having the size equivalent to or smaller than the wavelength of the electromagnetic wave incident on the light-receiving element 21. The protrusions 131 are separated by grooves 132 and 133 extending linearly in the X and Y directions. Grooves 132 and 133 at a light-condensing element 130 in a pixel region 20 continuously extend to grooves at a light-condensing element 130 in adjacent pixel regions 20. This state is schematically shown in FIG. 5. In FIG. 5, in the two-dimensional solid-state image pickup device, the outer edge of the pixel region 20 is indicated by dotted-chain lines, the pixel region 20 is indicated by dotted lines, and the grooves 132 and 133 are indicated by thick solid lines.

As described above, the protrusions 131 are separated by the grooves 132 and 133 which linearly extend and have very small widths, and thus a structure is formed in which a composite refractive index varies periodically in the X and Y directions. Hence, the electromagnetic wave can be condensed while the spatial distribution (XY-plane distribution) of the refractive indices is controlled. The physical mechanism of light condensing depends on the refractive-index distribution. This can attain a function equivalent to a function provided by an on-chip micro convex lens.

A method of forming the light-condensing element in the two-dimensional solid-state image pickup device according to Embodiment 1 will be described below. In a first patterning step of this method, the grooves extending linearly in one direction are formed by lithography and etching. In a second patterning step, the grooves extending linearly in the other direction are formed by lithography and etching.

[Step 100]

Fabrication (formation) of the light-receiving element 21 in the substrate 11, and formation of the light-shielding film 23, the smoothing layer 24, the wiring 25, and the color filter 22 are carried out by existing methods, and hence, the specific description of the existing methods is omitted.

[Step 110]

To form the light-condensing element 130, a SiN layer (optical material) 40 is formed on the color filter 22.

[Step 120]

Figure 10:
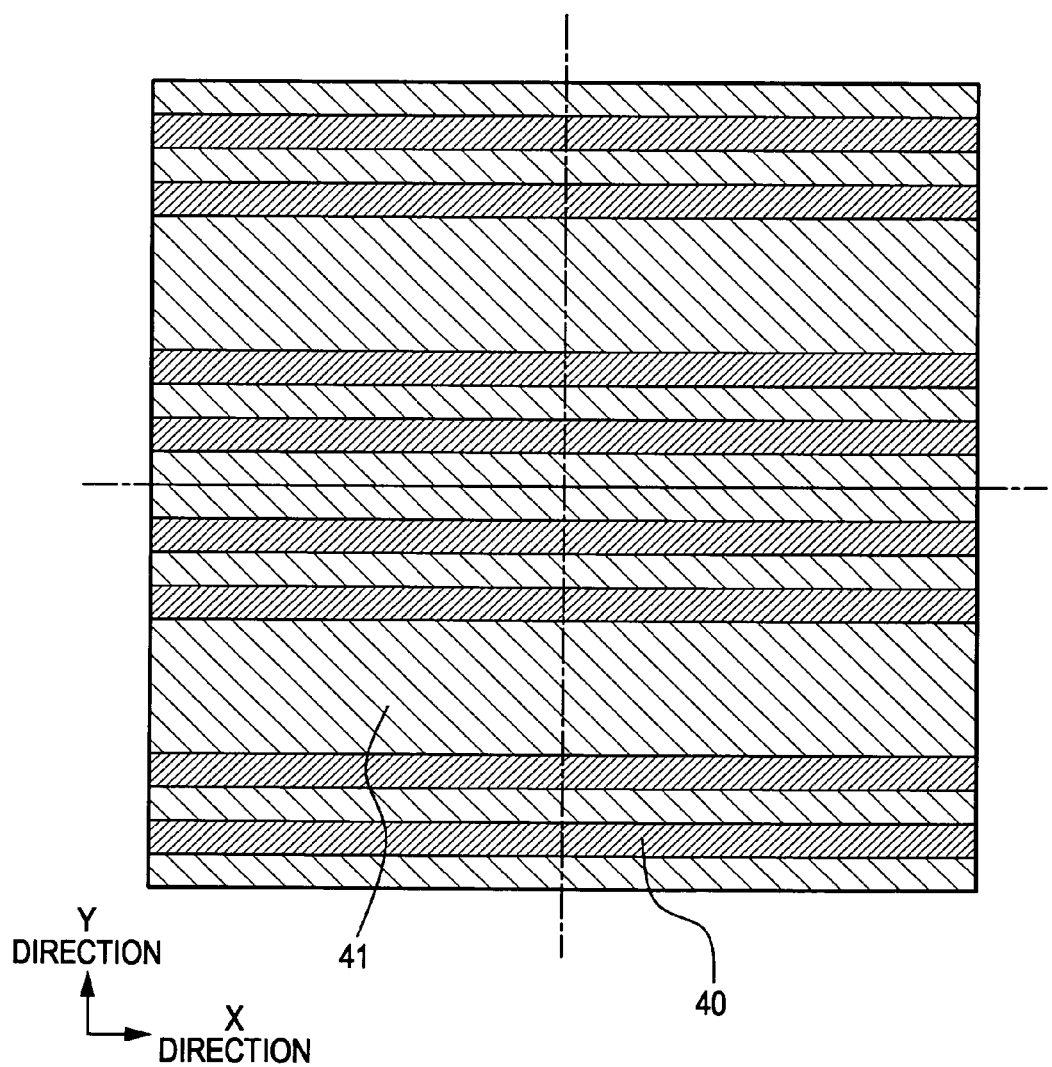
FIG. 10 is a layout view schematically showing a mask layer etc. to explain a method of manufacturing the light-condensing element according to Embodiment 1.
Figure 11:
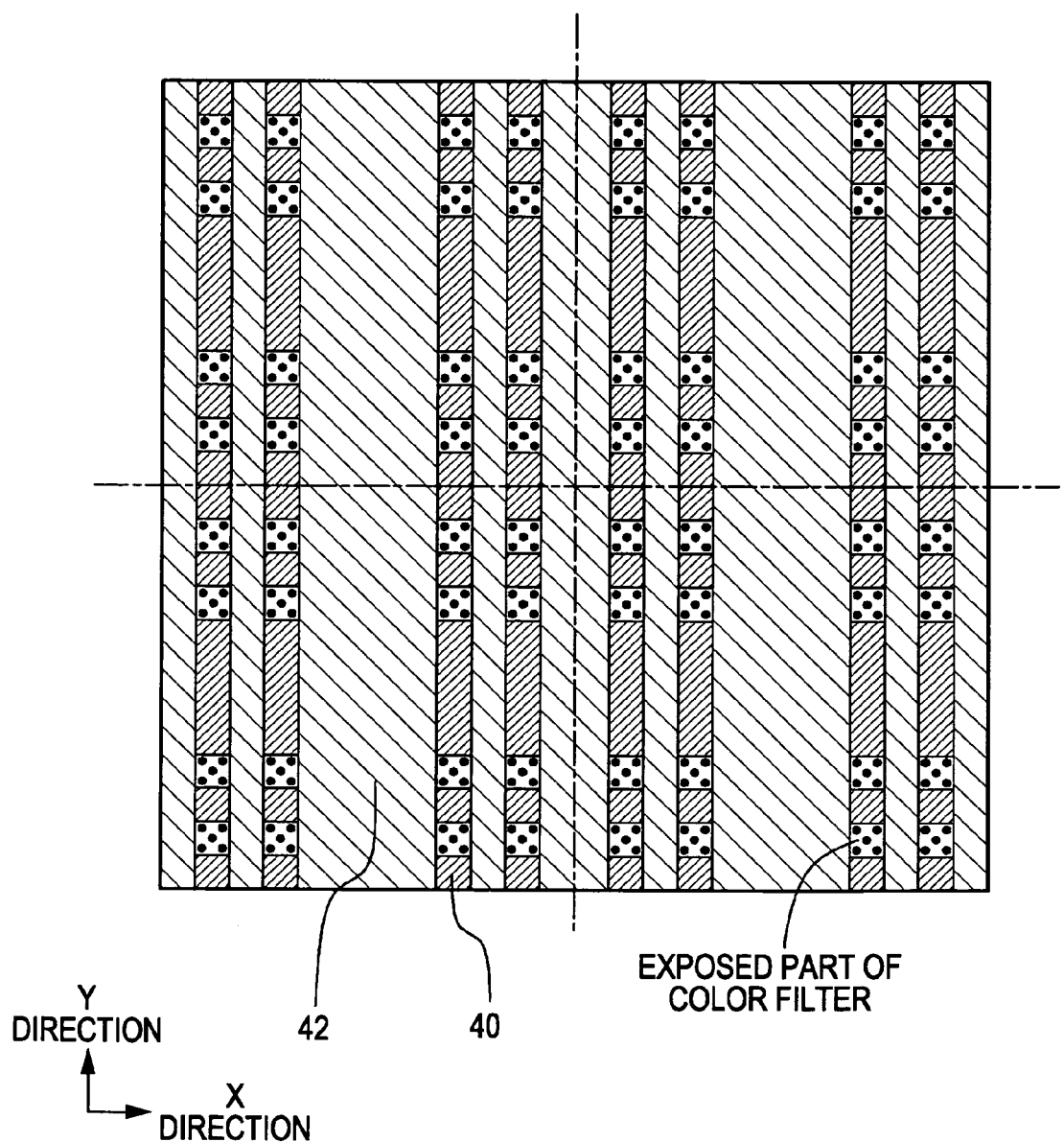
FIG. 11 is a layout view schematically showing the mask layer etc. to explain the method of manufacturing the light-condensing element according to Embodiment 1, subsequently to FIG. 10.

A first mask layer 41 is formed on the SiN layer 40. The first mask layer 41 is made of resist by lithography. This state is schematically shown in FIG. 10. FIGS. 10 and 11 are plan views schematically showing 2×2 pixel regions. In FIGS. 10 and 11, the first mask layer 41, a second mask layer 42, and the exposed optical material (SiN layer 40) are indicated by oblique lines. The boundaries of the pixel regions are indicated by dotted-chain lines. The exposed color filter 22 is indicated by black dots. The first mask layer 41 extends in the X direction, and has a line-and-stripe form. To form the first mask layer 41 or the second mask layer 42 (described later), although an exposure light source is selected depending on the material to be used, the exposure light source may use electromagnetic waves with a short wavelength, such as g-line, i-line, KrF excimer laser beam, ArF excimer laser beam, X ray, electron beam, or the like. Using the first mask layer 41 as an etching mask, the SiN layer 40 is etched by reactive ion etching (RIE). The patterning method may be any of physical patterning methods. Hence, the SiN layer 40 which has a line-and-stripe form and extends in the X direction can be obtained. Then, the first mask layer 41 is removed.

[Step 130]

The second mask layer 42 is formed on the SiN layer 40 and the exposed color filter 22 by lithography. The second mask layer 42 is made of resist. This state is schematically shown in FIG. 11. The second mask layer 42 extends in the Y direction, and has a line-and-stripe form. Using the second mask layer 42 as an etching mask, the SiN layer 40 is etched by RIE. Then, the second mask layer 42 is removed. Accordingly, the protrusions 131 each having a square cross section along the XY plane can be obtained.

Then, by applying isotropic etching, such as plasma etching or wet etching, the edge portion of each protrusion 131 (edge portion defined by a tip surface and a side surface of a protrusion) is rounded. Thusly, the light-condensing element 130 shown in FIGS. 3A to 3C or FIGS. 4A to 4C can be provided.

Alternatively, in [step 120], a hard mask layer is formed on a SiN layer, and a first mask layer is formed on the hard mask layer. Using the first mask layer, the hard mask layer is etched. Thusly, the hard mask layer which has a line-and-stripe form and extends in the X direction can be obtained. Then, the first mask layer is removed. A second mask layer is formed on the hard mask layer. Using the second mask layer, the hard mask layer is etched. Thusly, the hard mask layer with protrusions can be obtained. Each protrusion has a square cross section along the XY plane. Then, the second mask layer is removed. The hard mask layer is used as an etching mask. The SiN layer is etched, and then the hard mask layer is removed. With this method, the protrusions 131 each having a square cross section along the XY plane can be obtained.

Since this method uses the first and second patterning steps, the protrusion 131 can be highly accurately formed. Hence, variation in the angle defined by the side surfaces, which are orthogonal to each other, of the protrusion 131 can be prevented from appearing. The variation in characteristic of the light-condensing element 130 and the variation in quality can be prevented from appearing.

Figure 14:
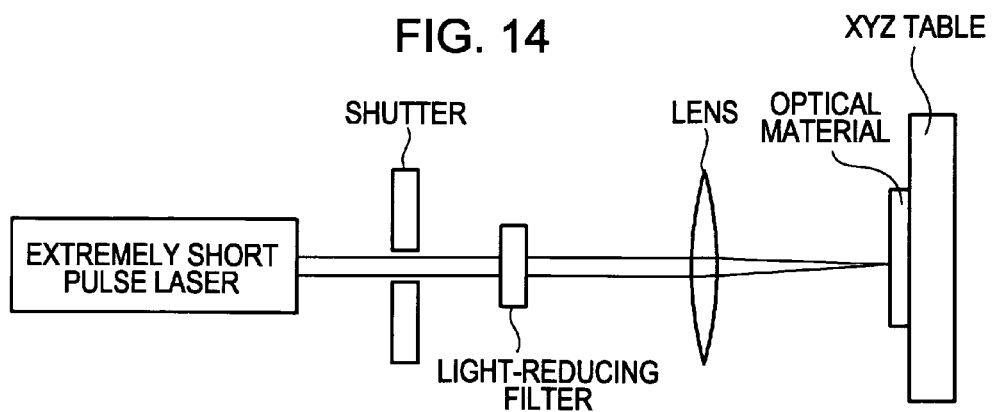
FIG. 14 is a conceptual diagram showing an extremely short pulse laser device.

For example, as long as processing accuracy of several tens of nanometers is achieved and the processing method does not adversely affect the light-condensing element etc., as shown in FIG. 14, any processing method, such as microprocessing with an extremely short pulse layer shown in FIG. 14, can be employed.

In the two-dimensional solid-state image pickup device according to Embodiment 1, the protrusion 131 of the light-condensing element 130, which is the sub-wavelength lens, has the rounded edge portion. Hence, the degree of the variation in composite refractive index (differential coefficient) in a propagating direction of an incident wave can be smoothened. Consequently, a reflection component at the surface of the light-condensing element can be reduced, and the electromagnetic wave can be efficiently condensed.

Regarding an on-chip micro convex lens of the related art, the on-chip micro convex lens is formed by melting a resist material through thermal reflowing, and using a surface tension of the resist material. Thus, it is extremely difficult to highly accurately fabricate an on-chip micro convex lens having a small focal length and a large curvature. Also, since the forming method uses the surface tension, it is difficult to form a structure other than a spherical structure. In contrast, regarding the light-condensing element according to Embodiment 1, a refractive-index distribution lens is provided by etching etc. Hence, the light-condensing element of the sub-wavelength lens can be provided, which has a similar function to a function of a micro convex lens or an aspherical convex lens corresponding to a very small pixel region, or a cylindrical lens for condensing light in one axial direction, with a higher degree of freedom. Also, the difference between the refractive index of the air (refractive index=1.00) serving as the filler substance and the refractive index of the optical material is used. Since the difference in the refractive index is large, the light-condensing element can highly accurately condense light even when the light is obliquely incident light.

The electromagnetic wave is totally reflected when the electromagnetic wave is incident from a high-refractive-index material (absolute refractive index: $n_{HIGH}$) to a low-refractive-index material (absolute refractive index: $n_{Low}$) at an angle (θ) or larger, expressed as follows, $\sin(\theta)=n_{LOW}/n_{HIGH}$.

When the pixel regions are separated by a gap with a larger width than the wavelength of the electromagnetic wave incident on the light-receiving element, a certain characteristic can be applied to the two-dimensional solid-state image pickup device, such that part of the electromagnetic wave is totally reflected by the interface of the light-condensing element. Accordingly, color mixture among pixels can be reduced, and the obliquely incident light can be efficiently totally reflected to be condensed at the light-condensing element. This advantage can be attained when the pixel regions are separated by continuously arranged gaps. When the pixel regions are separated by a gap with a width smaller than the wavelength of the electromagnetic wave incident on the light-receiving element, near-field light (evanescent light) from the interface of the light-condensing element propagates. Hence, the above description may not be applied to the recesses and the grooves inside the light-condensing element.

Also, the light-condensing element according to Embodiment 1 attains the refractive-index distribution on the basis of the combination of the linearly extending grooves. The highly accurate processing can be provided by lithography and etching. In the sub-wavelength lens of the related art, the concentric grooves are formed in the single pixel region, to provide the structure in which the Fresnel lens and the sub-wavelength are combined. In the light-condensing element according to any of the embodiments of the present invention, the processing accuracy of the protrusion and recess is improved to ¹⁄₁₀ or smaller. Thus, a sufficiently high characteristic can be provided merely by light-condensing effect because of a wave characteristic of the electromagnetic wave by the sub-wavelength lens. When the processing accuracy is improved, the single pixel region can be divided into smaller units. Consequently, the number of gradations of the refractive-index distribution can be increased for the further division of the single pixel.

In the sub-wavelength lens of the related art, the concentric structure is fabricated in the pixel region. Hence, it is difficult to reduce variation or error in the relative positional relationship between the pixel region and the light-condensing element. In contrast, in Embodiment 1, the groove at the light-condensing element in the pixel region continuously extends to the groove at the light-condensing element in the adjacent pixel region. Accordingly, the variation in grooves between the neighboring pixel regions can be further reduced. That is, the variation in light-condensing characteristic can be further reduced.

[Embodiment 2]

Figure 6:
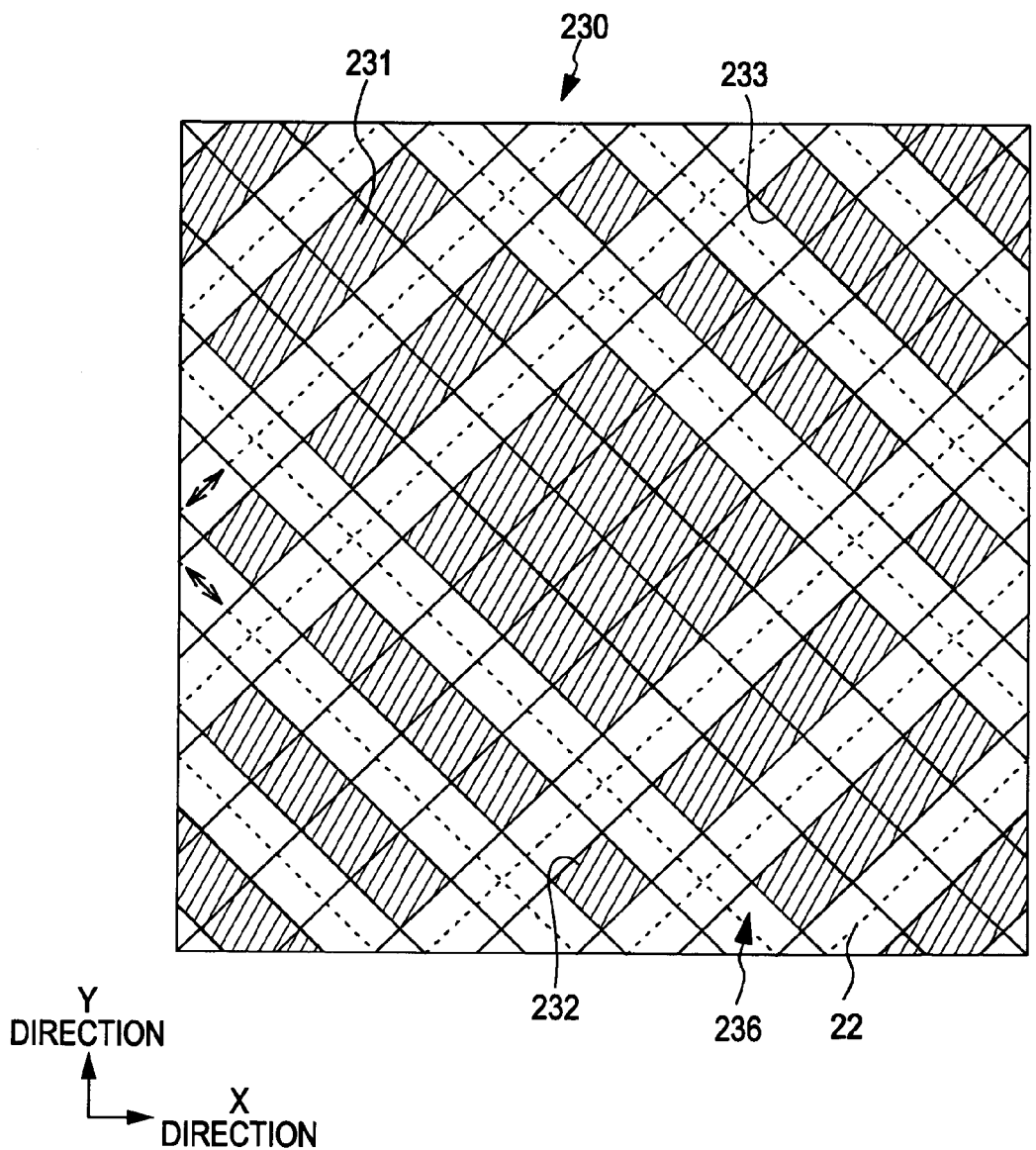
FIG. 6 is a plan layout view schematically showing the light-condensing element of the two-dimensional solid-state image pickup device according to Embodiment 2.

Embodiment 2 is a modification of Embodiment 1. FIG. 6 is a plan layout view schematically showing a light-condensing element of a two-dimensional solid-state image pickup device according to Embodiment 2. In the two-dimensional solid-state image pickup device according to Embodiment 2, a light-condensing element 230 is a sub-wavelength lens including protrusions 231 each having a size equivalent to or smaller than the wavelength of the electromagnetic wave incident on the light-receiving element 21. The protrusions 231 are separated by grooves 232 and 233 extending linearly in directions which are rotated by a desired angle from the X and Y directions. The desired angle is not particularly limited. For example, the desired angle may be ±45 degrees with reference to the X direction. In FIG. 6, the directions in which the grooves 232 and 233 extend are indicated by arrows.

The two-dimensional solid-state image pickup device according to Embodiment 2 is similar to the two-dimensional solid-state image pickup device according to Embodiment 1 except for the above-mentioned point. Hence, specific description is omitted.

[Embodiment 3]

Figure 7:
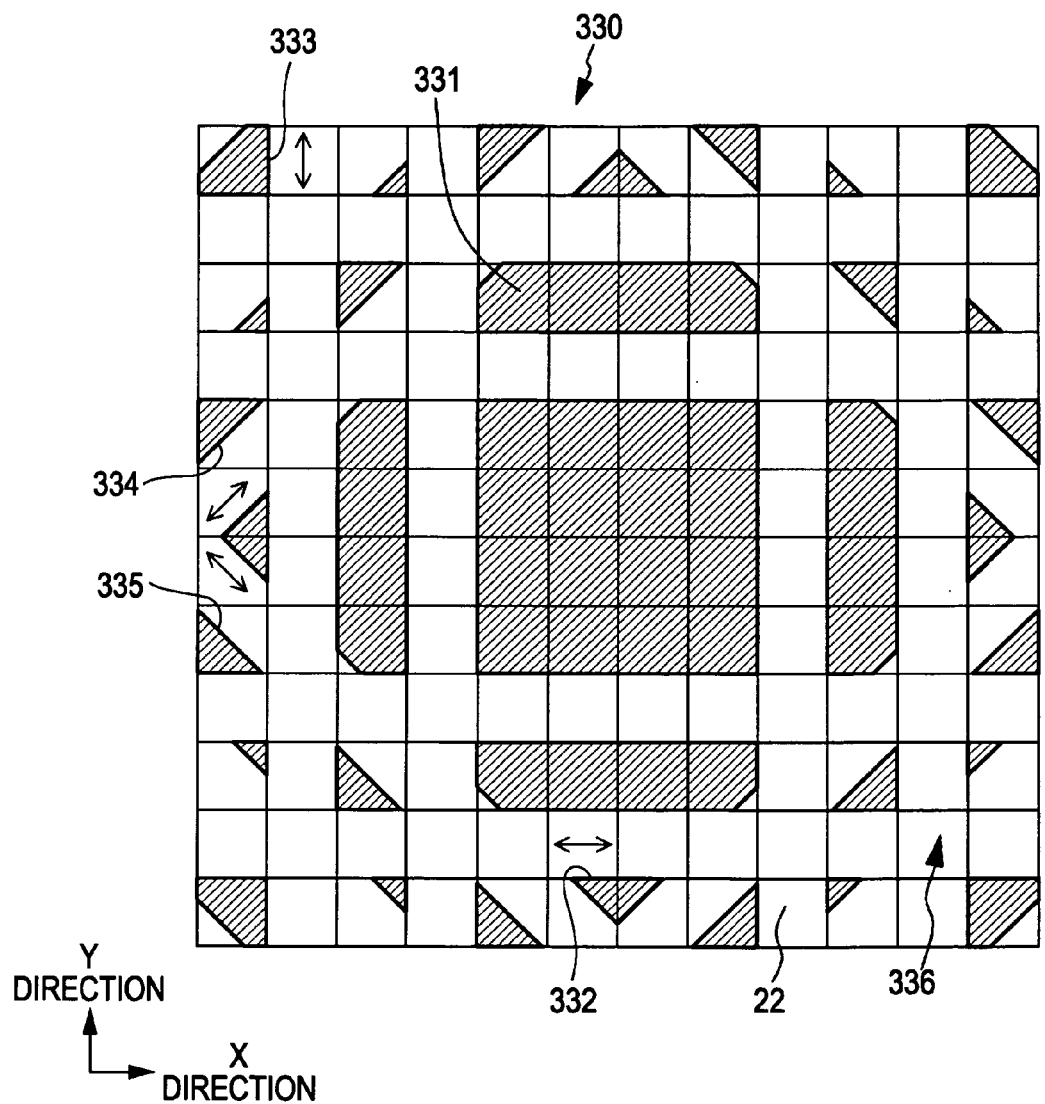
FIG. 7 is a plan layout view schematically showing the light-condensing element of the two-dimensional solid-state image pickup device according to Embodiment 3.

Embodiment 3 is a modification of Embodiment 1. FIG. 7 is a plan layout view schematically showing a light-condensing element of a two-dimensional solid-state image pickup device according to Embodiment 3. In the two-dimensional solid-state image pickup device according to Embodiment 3, a light-condensing element 330 is a sub-wavelength lens including protrusions 331 each having a size equivalent to or smaller than the wavelength of the electromagnetic wave incident on the light-receiving element 21. The protrusions 331 are separated by grooves 332 and 333 extending linearly in the X and Y directions and grooves 334 and 335 extending linearly in directions which are rotated by a desired angle (in particular, ±45 degrees) from the X and Y directions. In FIG. 7, the directions in which the grooves 332, 333, 334, and 335 extend are indicated by arrows. In the light-condensing element according to Embodiment 3, the grooves 334 and 335 may be formed, and then the grooves 332 and 333 may be formed.

The two-dimensional solid-state image pickup device according to Embodiment 3 is similar to the two-dimensional solid-state image pickup device according to Embodiment 1 except for the above-mentioned point. Hence, specific description is omitted. In the light-condensing element 330 according to Embodiment 3, the spatial distribution of the composite refractive indices is substantially concentric. Hence, the light-condensing characteristic similar to that of a circular convex lens can be obtained.

[Embodiment 4]

Figure 8A:
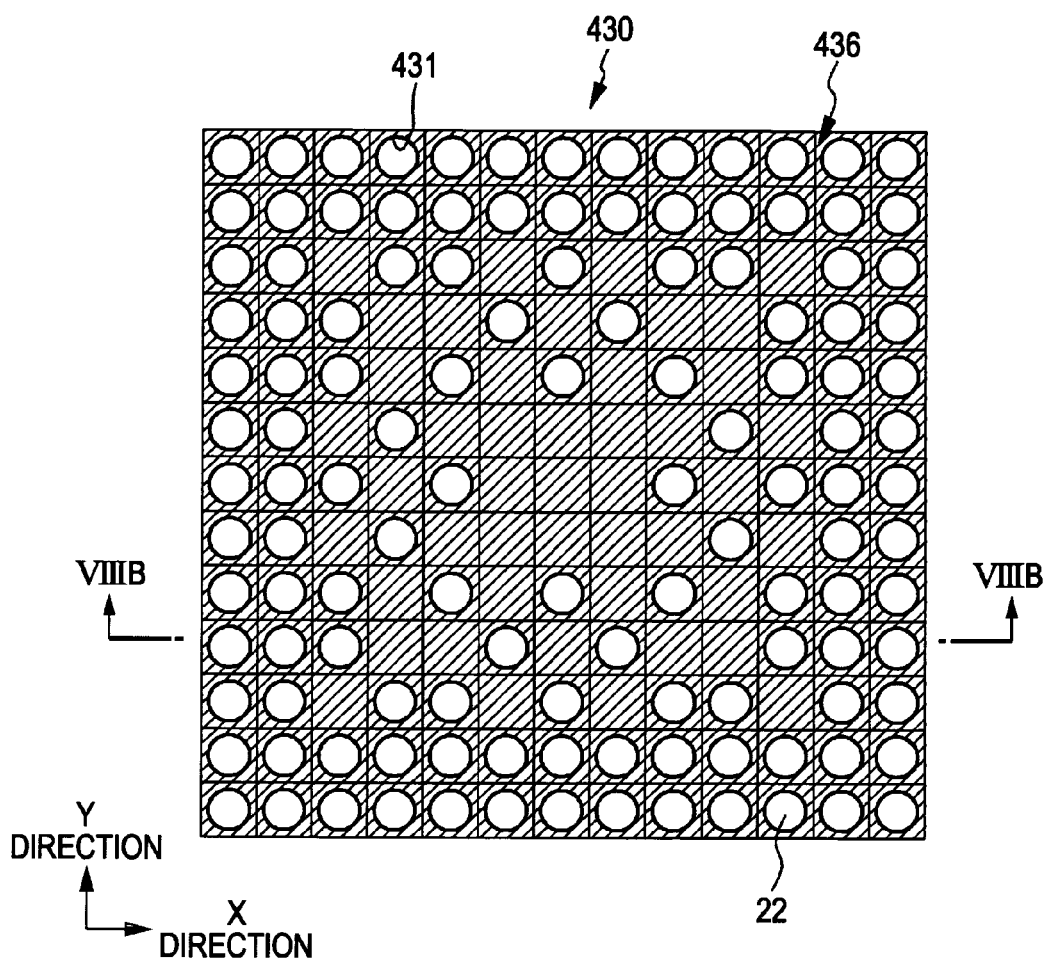
FIG. 8A is a plan layout view schematically showing the light-condensing element of the two-dimensional solid-state image pickup device according to Embodiment 4.
Figure 8B:
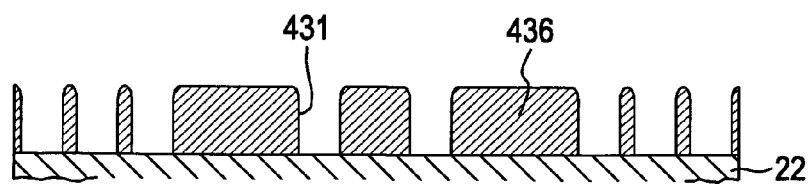
FIG. 8B is a cross-sectional conceptual diagram schematically showing the light-condensing element taken along arrows VIIIB-VIIIB.

Embodiment 4 relates to the two-dimensional solid-state image pickup device according to the second embodiment of the present invention. FIG. 8A is a plan layout view schematically showing a light-condensing element of a two-dimensional solid-state image pickup device according to Embodiment 4, and FIG. 8B is a cross-sectional conceptual diagram schematically showing the light-condensing element taken along arrows VIIIB-VIIIB. In the two-dimensional solid-state image pickup device according to Embodiment 4, a light-condensing element 430 is a sub-wavelength lens having recesses 431 each having a size equivalent to or smaller than the wavelength of the electromagnetic wave incident on the light-receiving element 21. The recesses 431 are arranged in the X and Y directions. Alternatively, the recesses 431 may be arranged at vertexes of a virtual square. Each recess 431 has a cross section of a circle along the XY plane. As described above, the expression $L_{unit}=50$ (nm) is established, and the diameter of the recess 431 is 50 nm. Reference numeral 436 denotes an inter-recess region.

In the example shown in FIG. 8A, the recesses 431 are regularly arranged. The density of the recesses 431 is decreased toward the center of the light-condensing element 430, and increased toward an edge portion of the light-condensing element 430. Accordingly, the light-condensing element having the function and effect similar to those shown in FIGS. 3A to 3C can be provided. Though not shown, when the density of the recesses 431 is increased toward the center of the light-condensing element 430 and decreased toward the edge portion of the light-condensing element 430, the light-condensing element having the function and effect similar to those shown in FIGS. 4A to 4C can be provided.

In the two-dimensional solid-state image pickup device according to Embodiment 4, the edge portion of each recess 431 (edge portion defined by a side surface of the recess and a top surface of an inter-recess region 436) of the light-condensing element 430 of the sub-wavelength lens is rounded. Hence, the degree of the variation in composite refractive index (differential coefficient) in a propagating direction of an incident wave can be smoothened. Consequently, a reflection component at the surface of the light-condensing element can be reduced, and the electromagnetic wave can be efficiently condensed.

Figure 9:
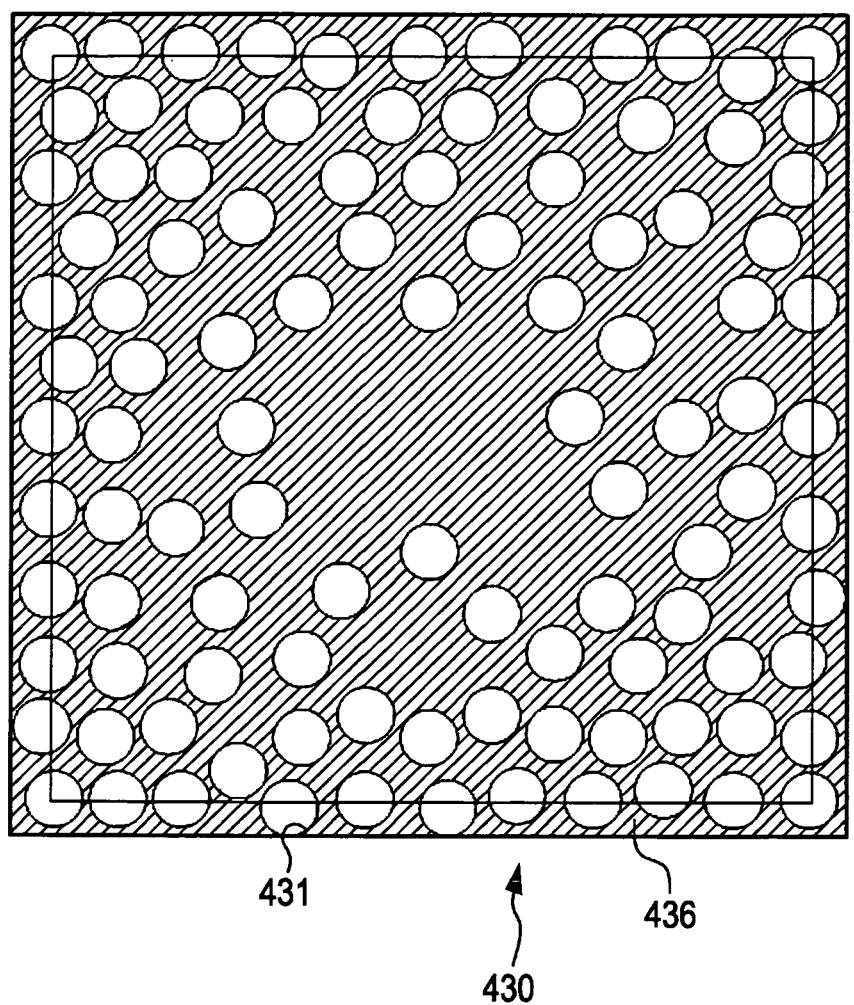
FIG. 9 is a plan layout view schematically showing a light-condensing element of a two-dimensional solid-state image pickup device according to a modification of Embodiment 4.

Referring to FIG. 9, the recesses 431 may be irregularly arranged. When the recesses 431 are irregularly arranged, an in-plane distribution variation component of systematic recesses can be reduced, and a systematic error can be reduced. Alternatively, the recesses 431 may be arranged at vertexes of a virtual square or regular hexagon. The density distribution of the recesses determines the value of the composite refractive index. Hence, although the diameter and circularity of the recess have low accuracy, the low accuracy does not adversely affect the composite refractive index. Even when the recesses are arranged close to one another or are separated, and when the recesses are regularly or irregularly arranged, although the diameters and shapes of the recesses vary, such variation does not adversely affect the composite refractive index, as long as an average refractive-index distribution, which is obtained when the refractive indices are smoothened (averaged) in accordance with the degree of the spread of the electromagnetic wave, can be controlled.

[Others]

The preferred embodiments of the present invention have been described, however, the present invention is not limited thereto. The configuration and structure of the two-dimensional solid-state image pickup device, the arrangement state of the protrusions or the recesses in the light-condensing element, the optical material of the light-condensing element, the manufacturing method of the light-condensing element are merely exemplified in the above-described embodiments, and may be appropriately modified. The optical material of the light-condensing element may be, for example, a photonic crystal, in which a low-refractive-index material (e.g., $SiO_2$ or $MgF_2$) and a high-refractive-index material (e.g., a semiconductor material such as Si or Ge, or an oxide or nitride, such as $TiO_2$, $Ta_2O_5$, or SiN) are layered on one another. Also, in the embodiments, the CMOS image sensor has been exemplified. However, other solid-state image pickup device such as a CCD image sensor may be alternatively used.

The present application contains subject matter related to that disclosed in Japanese Priority Patent Application JP 2008-302891 filed in the Japan Patent Office on Nov. 27, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image pickup device comprising:
a plurality of pixel regions arranged in an array within a first plane, respective ones of the pixel regions including a light-condensing element formed on a light-receiving element, wherein
the light-condensing element includes protrusions separated by recesses, the recesses being filled with a substance having a refractive index different from a refractive index of a material of the protrusions,
respective ones of the protrusions having a width in a direction parallel to the first plane that is equal to or less than a wavelength of an electromagnetic wave incident on the light-receiving element, and
respective ones of the protrusions including an edge portion that is rounded and a side surface that is perpendicular or nearly perpendicular to the first plane, wherein
the protrusions include a first protrusion extending linearly in a first direction and a second protrusion extending linearly in a second direction, the first and second direction being parallel to the first plane,
the recesses include a first recess extending linearly in the first direction and a second recess extending linearly in the second direction, wherein the first recess extends from a first pixel region of the plurality of pixel regions to an adjacent pixel region of the plurality of pixel regions, and
the first protrusion is separate from the second protrusion.

2. The image pickup device according to claim 1, wherein the first direction is perpendicular to the second direction.

3. The image pickup device according to claim 1, wherein the second direction is offset from the first direction by a first offset angle, the first offset angle being ±30 degrees, ±45 degrees, or ±60 degrees.

4. The image pickup device according to claim 1, wherein
the protrusions include a third protrusion extending linearly in a third direction, the third direction being parallel to the first plane, and
the third direction is offset from the first direction by a second offset angle.

5. The image pickup device according to claim 4, wherein
the protrusions include a fourth protrusion extending linearly in a fourth direction, the fourth direction being parallel to the first plane, and
the fourth direction is offset from the first direction by a third offset angle.

6. The image pickup device according to claim 4, wherein the first direction is perpendicular to the second direction.

7. The image pickup device according to claim 6, wherein the second offset angle is ±45 degrees.

8. The image pickup device according to claim 4, wherein the third protrusion is superimposed over the first protrusion and the second protrusion.

9. The image pickup device according to claim 5, wherein the third protrusion and the fourth protrusion are superimposed over the first protrusion and the second protrusion.

10. The image pickup device according to claim 1, wherein the protrusions have a periodic structure with a period expressed as: $\lambda_0/(p \cdot n_0)$,
where p is a positive number, $\lambda_0$ is the wavelength of the electromagnetic wave incident on the light-receiving element, and $n_0$ is a refractive index of a material of the light-condensing element is $n_0$.

11. The image pickup device according to claim 1, wherein each of the protrusions includes a top surface that is parallel to the first plane, the edge portion being between the top surface and the side surface.

12. An image pickup device comprising:
a plurality of pixel regions arranged in an array within a first plane, respective ones of the pixel regions including a light-condensing element formed on a light-receiving element, wherein
the light-condensing element includes recesses separated by protrusions, the recesses being filled with a substance having a refractive index different from a refractive index of a material of the protrusions,
respective ones of the recesses having a width in a direction parallel to the first plane that is equal to or less than a wavelength of an electromagnetic wave incident on the light-receiving element, and
respective ones of the recesses including an edge portion that is rounded and a side surface that is perpendicular or nearly perpendicular to the first plane, wherein
the protrusions include a first protrusion extending linearly in a first direction and a second protrusion extending linearly in a second direction, the first and second direction being parallel to the first plane,
the recesses include a first recess extending linearly the first direction and a second recess extending linearly in the second direction, wherein the first recess extends from a first pixel region of the plurality of pixel regions to an adjacent pixel region of the plurality of pixel regions, and
the first protrusion is separate from the second protrusion.

13. The image pickup device according to claim 12, wherein the first direction is perpendicular to the second direction.

14. The image pickup device according to claim 12, wherein the second direction is offset from the first direction by a first offset angle, the first offset angle being ±30 degrees, ±45 degrees, or ±60 degrees.

15. The image pickup device according to claim 12, wherein
the protrusions include a third protrusion extending linearly in a third direction, the third direction being parallel to the first plane, and
the third direction is offset from the first direction by a second offset angle.

16. The image pickup device according to claim 15, wherein
the protrusions include a fourth protrusion extending linearly in a fourth direction, the fourth direction being parallel to the first plane, and
the fourth direction is offset from the first direction by a third offset angle.

17. The image pickup device according to claim 16, wherein the second offset angle is ±45 degrees, and
the third direction is perpendicular to the fourth direction.

18. The image pickup device according to claim 17, wherein the third protrusion and the fourth protrusion are superimposed over the first protrusion and the second protrusion.

19. The image pickup device according to claim 13, wherein the protrusions have a periodic structure with a period expressed as: $\lambda_0/(p \cdot n_0)$,
where p is a positive number, $\lambda_0$ is the wavelength of the electromagnetic wave incident on the light-receiving element, and $n_0$ is a refractive index of a material of the light-condensing element is $n_0$.

20. The image pickup device according to claim 13, wherein each of the protrusions includes a top surface that is parallel to the first plane, the edge portion being between the top surface and the side surface.

21. The image pickup device according to claim 13, wherein the recesses are arranged in a pattern, and
in the pattern, a density of the recesses decreases toward a center of the light-condensing element and increases toward a peripheral region of the light-condensing element.

22. The image pickup device according to claim 21, wherein a first portion of the recesses are arranged linearly in a first direction and a second portion of the recesses are arranged linearly in a second direction, the first direction and the second direction being parallel to the first plane.

23. The image pickup device according to claim 22, wherein the first direction is perpendicular to the second direction.

24. The image pickup device according to claim 22, wherein the second direction is offset from the first direction by a first offset angle, the first offset angle being ±30 degrees, ±45 degrees, or ±60 degrees.

25. The image pickup device according to claim 22, wherein
a third portion of the recesses are arranged linearly in a third direction and a fourth portion of the recesses are arranged linearly in a fourth direction, the protrusions include a third protrusion extending linearly in a third direction, the third direction and the fourth direction being parallel to the first plane, and
the third direction is offset from the first direction by a second offset angle and the fourth direction is offset from the first direction by a third offset angle.

26. The image pickup device according to claim 25, wherein the second offset angle is ±45 degrees, and
the third direction is perpendicular to the fourth direction.

27. The image pickup device according to claim 13, wherein the recesses are arranged in an irregular distribution without a pattern, and
in the irregular distribution, a density of the recesses decreases toward a center of the light-condensing element and increases toward a peripheral region of the light-condensing element.

28. An image pickup device comprising:
a plurality of pixel regions arranged in an array within a first plane, respective ones of the pixel regions including a light-condensing element formed on a light-receiving element, wherein
the light-condensing element includes protrusions separated by recesses, the recesses being filled with a substance having a refractive index different from a refractive index of a material of the protrusions,
respective ones of the protrusions having a width in a direction parallel to the first plane that is equal to or less than a wavelength of an electromagnetic wave incident on the light-receiving element,
respective ones of the protrusions including an edge portion that is rounded and a side surface that is perpendicular or nearly perpendicular to the first plane,
the protrusions include a first protrusion extending linearly in a first direction, a second protrusion extending linearly in a second direction, and a third protrusion extending linearly in a third direction, the first, second, and third directions being parallel to the first plane,
the third direction is offset from the first direction by a second offset angle, and
the third protrusion is superimposed over the first protrusion and the second protrusion.

* * * * *